(12) United States Patent
Iga et al.

(10) Patent No.: US 12,046,291 B2
(45) Date of Patent: Jul. 23, 2024

(54) SEMICONDUCTOR MEMORY DEVICE

(71) Applicant: Kioxia Corporation, Tokyo (JP)

(72) Inventors: Masahiko Iga, Yokohama Kanagawa (JP); Kenro Kikuchi, Fujisawa Kanagawa (JP); Nobushi Matsuura, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 148 days.

(21) Appl. No.: 17/930,625

(22) Filed: Sep. 8, 2022

(65) Prior Publication Data

US 2023/0307060 A1 Sep. 28, 2023

(30) Foreign Application Priority Data

Mar. 22, 2022 (JP) .................... 2022-044981

(51) Int. Cl.
*G11C 16/14* (2006.01)
*G11C 16/26* (2006.01)
*G11C 16/34* (2006.01)
*G11C 16/04* (2006.01)

(52) U.S. Cl.
CPC ............. *G11C 16/14* (2013.01); *G11C 16/26* (2013.01); *G11C 16/3445* (2013.01); *G11C 16/3459* (2013.01); *G11C 16/0483* (2013.01)

(58) Field of Classification Search
CPC ..... G11C 16/14; G11C 16/26; G11C 16/3445; G11C 16/3459; G11C 16/0483
See application file for complete search history.

(56) References Cited

U.S. PATENT DOCUMENTS

| | | | |
|---|---|---|---|
| 10,978,165 B2 | 4/2021 | Nishikawa et al. | |
| 11,139,038 B1 | 10/2021 | Masuduzzaman et al. | |
| 2016/0099060 A1* | 4/2016 | Yoo ..................... | G11C 29/021 365/185.11 |
| 2020/0004440 A1 | 1/2020 | Koudele et al. | |

FOREIGN PATENT DOCUMENTS

JP          2020-9511          1/2020

* cited by examiner

*Primary Examiner* — Han Yang
(74) *Attorney, Agent, or Firm* — Finnegan, Henderson, Farabow, Garrett & Dunner, LLP

(57) ABSTRACT

A semiconductor memory device performs a write operation and an erase operation. The write operation includes a first program operation that applies a first program voltage to a first conductive layer. The first program voltage increases by a first offset voltage together with an increase in an execution count of a first write loop. An erase operation includes a program voltage control operation and an erase voltage supply operation that applies an erase voltage to a first wiring. The program voltage control operation includes a second program operation that applies a second program voltage to a third conductive layer. The second program voltage increases by a second offset voltage together with an increase in a number of times of execution of a second write loop. A magnitude of the first program voltage is adjusted according to a magnitude of the second program voltage.

12 Claims, 29 Drawing Sheets

| 1-3-3 code | Er | A | B | C | D | E | F | G |
|---|---|---|---|---|---|---|---|---|
| Upper | 1 | 1 | 0 | 0 | 0 | 1 | 1 | 0 |
| Middle | 1 | 0 | 0 | 1 | 1 | 1 | 0 | 0 |
| Lower | 1 | 1 | 1 | 1 | 0 | 0 | 0 | 0 |

| 1-2-4 code | Er | A | B | C | D | E | F | G |
|---|---|---|---|---|---|---|---|---|
| Upper | 1 | 0 | 0 | 1 | 1 | 0 | 0 | 1 |
| Middle | 1 | 1 | 0 | 0 | 0 | 0 | 1 | 1 |
| Lower | 1 | 1 | 1 | 1 | 0 | 0 | 0 | 0 |

US 12,046,291 B2

SEMICONDUCTOR MEMORY DEVICE

CROSS-REFERENCE TO RELATED APPLICATIONS

This application is based upon and claims the benefit of Japanese Patent Application No. 2022-044981, filed on Mar. 22, 2022, the entire contents of which are incorporated herein by reference.

FIELD

Background

Embodiments described herein relate generally to a semiconductor memory device.

Description of the Related Art

There has been known a semiconductor memory device that includes a substrate, a plurality of first conductive layers arranged in a first direction intersecting with a surface of the substrate, and a semiconductor layer extending in the first direction and opposed to the plurality of first conductive layers.

DETAILED DESCRIPTION

Figure 1:
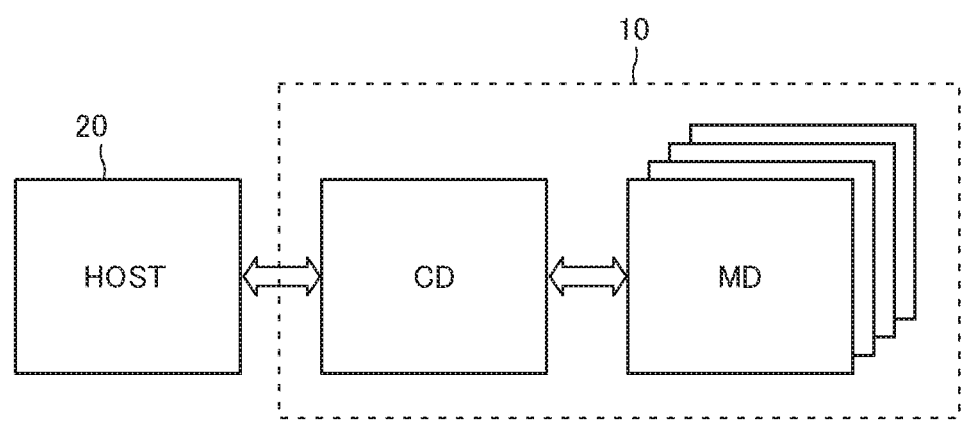
FIG. 1 is a schematic block diagram illustrating a configuration of a memory system 10.

A semiconductor memory device according to one embodiment comprises: a substrate; a plurality of conductive layers arranged in a first direction intersecting with a surface of the substrate; a first semiconductor layer that extends in the first direction and is opposed to the plurality of conductive layers; an electric charge accumulating layer disposed between the plurality of conductive layers and the first semiconductor layer; a first wiring electrically connected to one end portion in the first direction of the first semiconductor layer; and a control circuit electrically connected to the plurality of conductive layers and the first wiring. The control circuit is configured to be able to perform a write operation and an erase operation. The write operation includes a plurality of first write loops. Each of the plurality of first write loops includes a first program operation. The first program operation applies a first program voltage to a first conductive layer as one of the plurality of conductive layers and applies a write pass voltage smaller than the first program voltage to a second conductive layer as one of the plurality of conductive layers. The first program voltage increases by a first offset voltage together with an increase in a number of times of execution of the first write loop. The erase operation includes: a program voltage control operation; and an erase voltage supply operation that applies an erase voltage to the first wiring after performing the program voltage control operation. The program voltage control operation includes a plurality of second write loops. Each of the plurality of second write loops includes a second program operation. The second program operation applies a second program voltage to a third conductive layer as one of the plurality of conductive layers and applies the write pass voltage to a fourth conductive layer as one of the plurality of conductive layers. The second program voltage increases by a second offset voltage together with an increase in a number of times of execution of the second write loop. When the first program voltage in the first write loop performed first in the write operation is set as a third program voltage and the second program voltage in the second write loop performed last in the program voltage control operation is set as a fourth program voltage, a magnitude of the third program voltage is adjusted according to a magnitude of the fourth program voltage.

Next, the semiconductor memory devices according to embodiments will be described in detail with reference to the drawings. The following embodiments are only examples, and not described for the purpose of limiting the present invention.

In this specification, when referring to a "semiconductor memory device", it may mean a memory die (a memory chip) and may mean a memory system including a controller die, such as a memory card and an SSD. Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane is referred to as a first direction, a direction intersecting with the first direction along this predetermined plane is referred to as a second direction, and a direction intersecting with this predetermined plane is referred to as a third direction in some cases. These first direction, second direction, and third direction may correspond to any of the X-direction, the Y-direction, and the Z-direction and need not to correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, when referring to a "width", a "length", a "thickness", or the like of a configuration, a member, or the like in a predetermined direction, this may mean a width, a length, a thickness, or the like in a cross-sectional surface or the like observed with a Scanning electron microscopy (SEM), a Transmission electron microscopy (TEM), or the like.

First Embodiment

[Memory System 10]

FIG. 1 is a schematic block diagram illustrating a configuration of the memory system 10.

The memory system 10, for example, reads, writes, and erases user data according to a signal transmitted from a host computer 20. The memory system 10 is, for example, any system that can store the user data including a memory chip, a memory card, and an SSD. The memory system 10 includes a plurality of memory dies MD that store the user data and a controller die CD connected to these plurality of memory dies MD and host computer 20. The controller die CD includes, for example, a processor, a RAM, a ROM, an ECC circuit, and the like, and performs processing, such as conversion between a logical address and a physical address, bit error detection/correction, and a wear leveling.

[Configuration of Memory Die MD]

Figure 2:
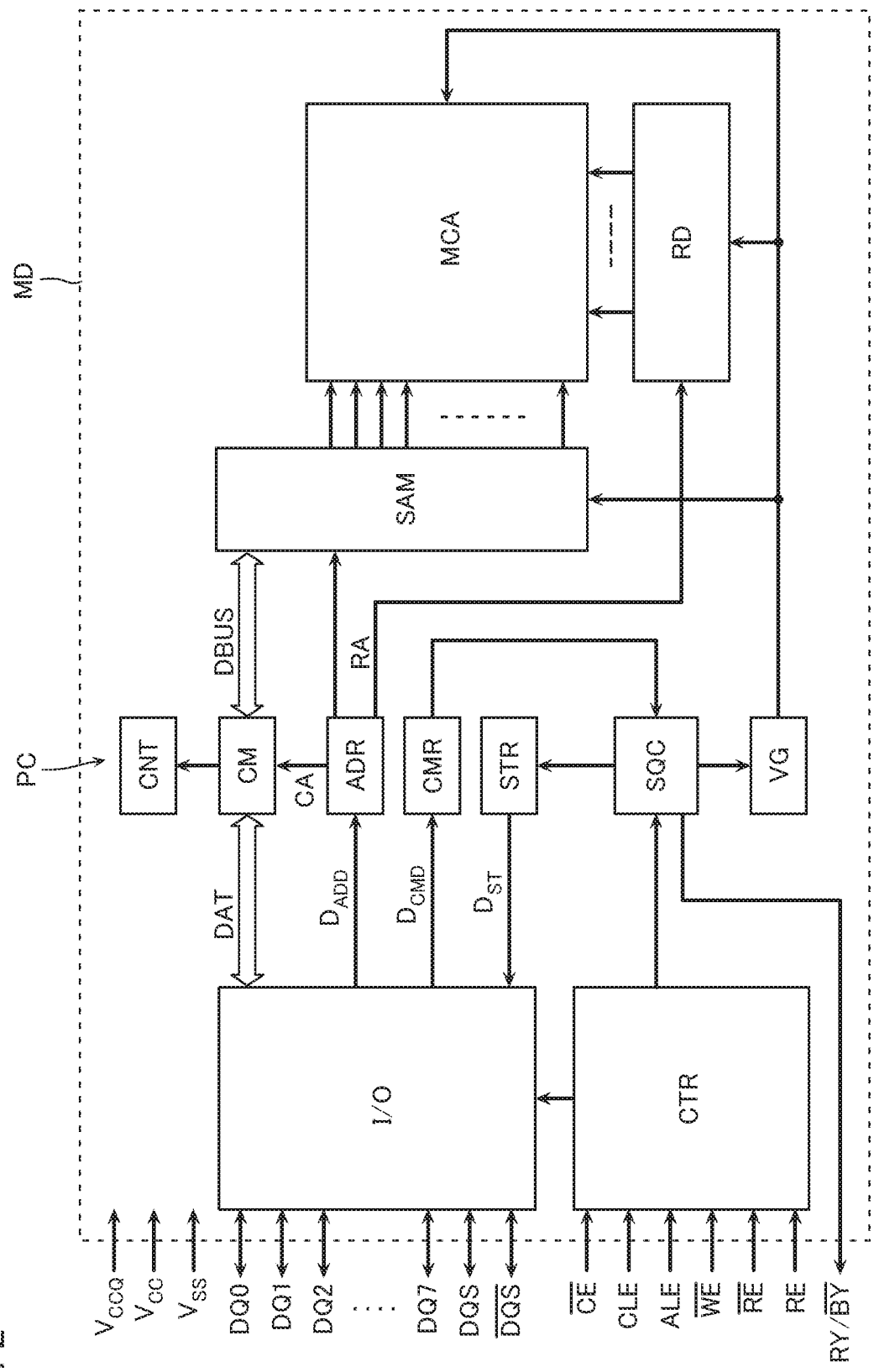
FIG. 2 is a schematic block diagram illustrating a configuration of a memory die MD according to a first embodiment.
Figure 3:
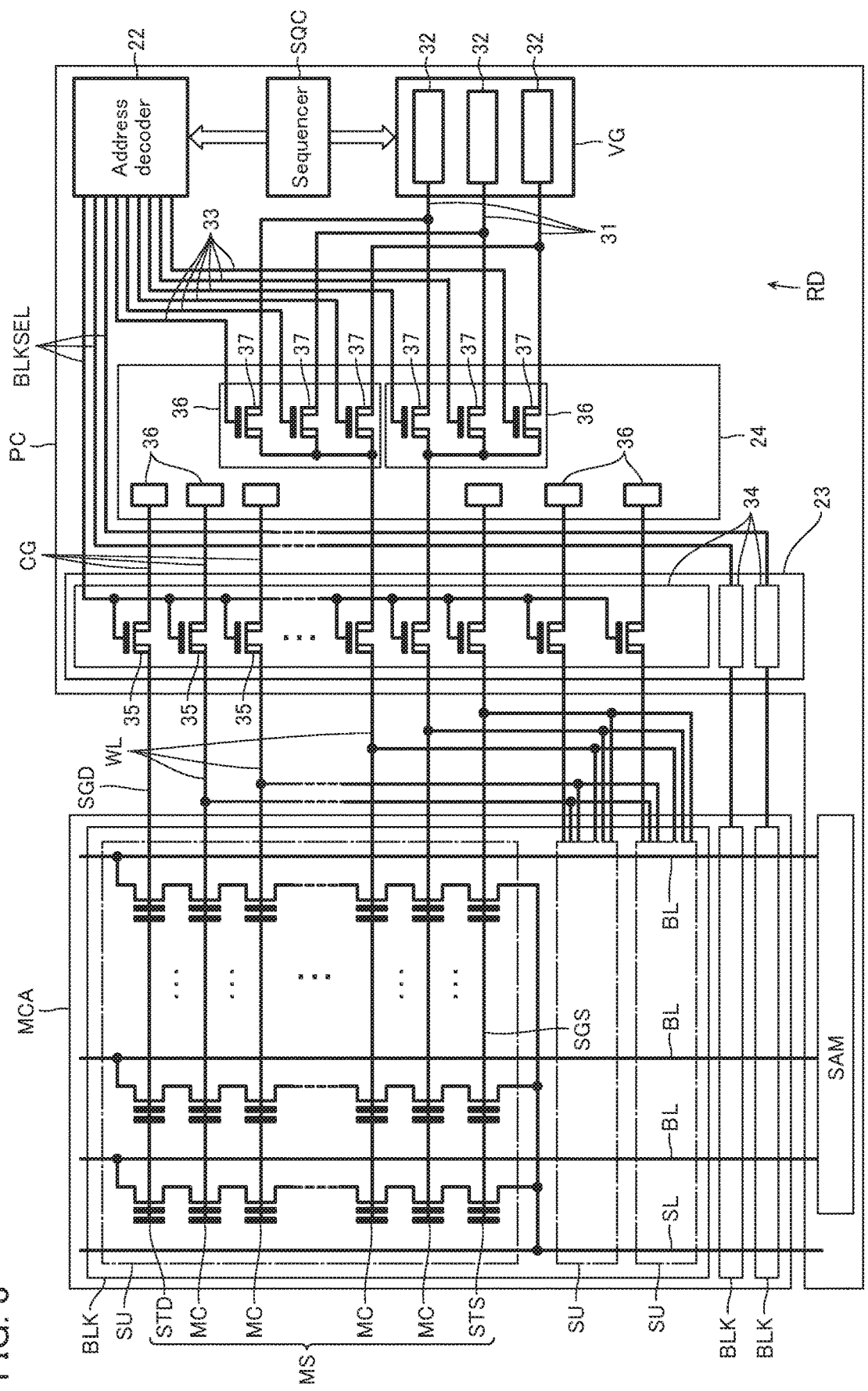
FIG. 3 is a schematic circuit diagram illustrating a configuration of a part of the memory die MD.
Figure 4:
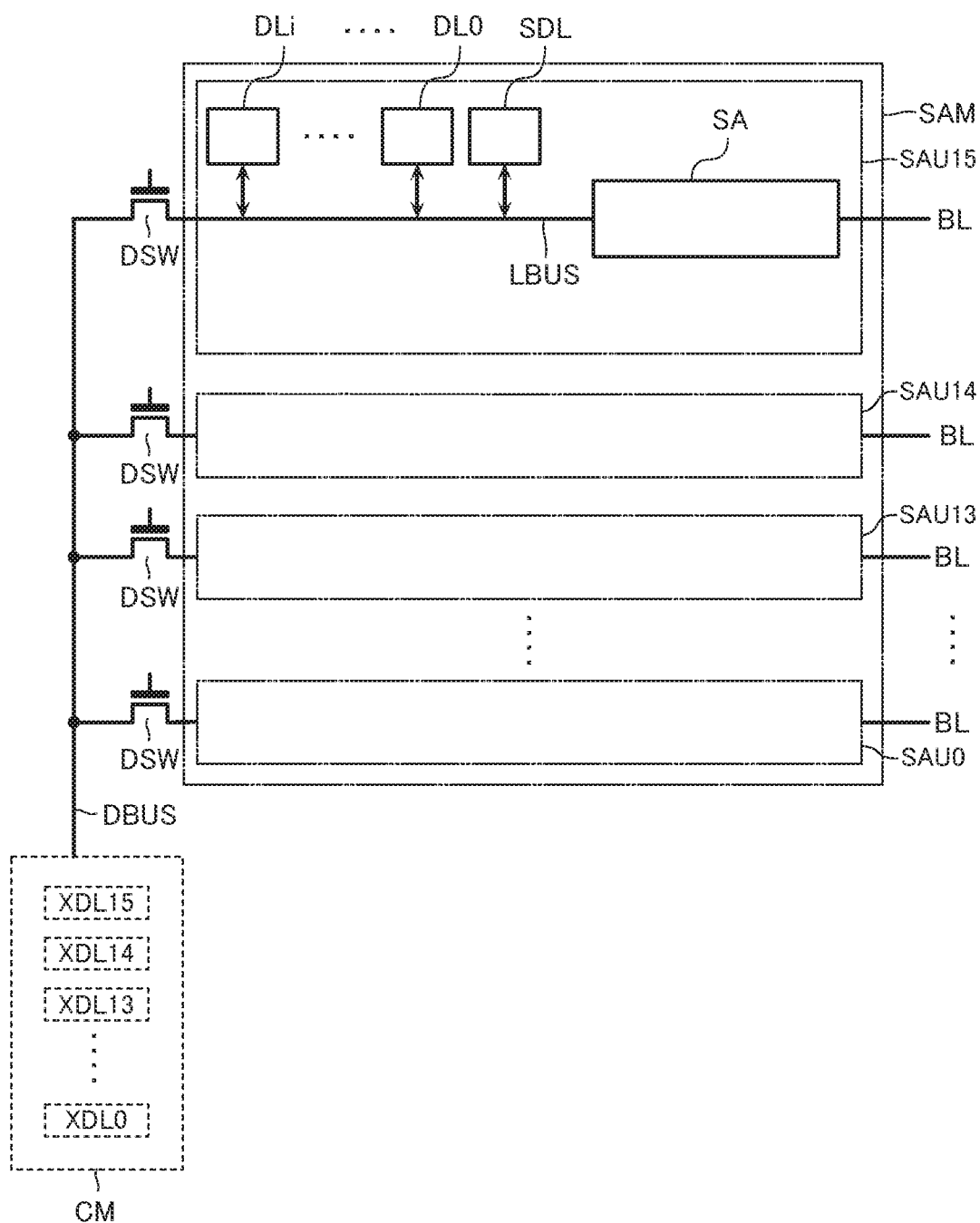
FIG. 4 is a schematic block diagram illustrating a configuration of a sense amplifier module SAM.

FIG. 2 is a schematic block diagram illustrating the configuration of the memory die MD according to the first embodiment. FIG. 3 is a schematic circuit diagram illustrating a configuration of a part of the memory die MD. FIG. 4 is a schematic block diagram illustrating a configuration of a sense amplifier module SAM.

FIG. 2 illustrates a plurality of control terminals and the like. These plurality of control terminals are represented as control terminals corresponding to a high active signal (a positive logic signal) in some cases, represented as control terminals corresponding to a low active signal (a negative logic signal) in some cases, and represented as control terminals corresponding to both the high active signal and the low active signal in some cases. In FIG. 2, a reference sign of the control terminal corresponding to the low active signal includes an over line (overbar). In this specification, a reference sign of the control terminal corresponding to the low active signal includes a slash ("/").

The description of FIG. 2 is an example, and specific aspects are appropriately adjustable. For example, a part of or all of the high active signals can be changed to the low active signals, or a part of or all of the low active signals can be changed to the high active signals. Additionally, a terminal RY/(/BY) described later outputs a ready signal as the high active signal and a busy signal as the low active signal. The slash ("/") between RY and (/BY) indicates a break between the ready signal and the busy signal.

As illustrated in FIG. 2, the memory die MD includes a memory cell array MCA storing data and a peripheral circuit PC connected to the memory cell array MCA.

[Circuit Configuration of Memory Cell Array MCA]

As illustrated in FIG. 3, the memory cell array MCA includes a plurality of memory blocks BLK. Each of these plurality of memory blocks BLK includes a plurality of string units SU. Each of these plurality of string units SU includes a plurality of memory strings MS. Each of these plurality of memory strings MS has one end connected to the peripheral circuit PC via a bit line BL. Each of these plurality of memory strings MS has the other end connected to the peripheral circuit PC via a common source line SL.

The memory string MS includes a drain-side select transistor STD, a plurality of memory cells MC (memory cell transistors), and a source-side select transistor STS, which are connected in series between the bit line BL and the source line SL. Hereinafter, the drain-side select transistor STD and the source-side select transistor STS are simply referred to as select transistors (STD, STS) in some cases.

The memory cell MC is a field-effect type transistor (memory transistor) that includes a semiconductor layer, a gate insulating film, and a gate electrode. The semiconductor layer functions as a channel region. The gate insulating film includes an electric charge accumulating film. The memory cell MC has a threshold voltage that changes according to an electric charge amount in the electric charge accumulating film. The memory cell MC usually stores the data of one bit or a plurality of bits. Respective word lines WL are connected to the gate electrodes of the plurality of memory cells MC corresponding to one memory string MS. Each of these word lines WL is connected to all the memory strings MS in one memory block BLK in common.

The select transistors (STD, STS) are field-effect type transistors that each include a semiconductor layer, a gate insulating film, and a gate electrode. The semiconductor layer functions as a channel region. A drain-side select gate line SGD and a source-side select gate line SGS are connected to gate electrodes of the select transistors (STD, STS), respectively. The drain-side select gate line SGD is disposed corresponding to the string unit SU and is connected in common to all the memory strings MS in one string unit SU. The source-side select gate line SGS is connected in common to all the memory strings MS in the memory block BLK. Hereinafter, the drain-side select gate line SGD and the source-side select gate line SGS is simply referred to as select gate lines (SGD, SGS) in some cases.

[Circuit Configuration of Peripheral Circuit PC]

The peripheral circuit PC includes a row decoder RD, a sense amplifier module SAM, a cache memory CM, a counter CNT, a voltage generation circuit VG, and a sequencer SQC as illustrated in FIG. 2. The peripheral circuit PC includes an address register ADR, a command register CMR, and a status register STR. The peripheral circuit PC includes an input/output control circuit I/O and a logic circuit CTR.

[Configuration of Row Decoder RD]

For example, as illustrated in FIG. 3, the row decoder RD (FIG. 2) includes an address decoder 22 that decodes address data $D_{ADD}$ (FIG. 2). The row decoder RD (FIG. 2) includes a block select circuit 23 and a voltage select circuit 24 that transfer an operating voltage to the memory cell array MCA according to an output signal from the address decoder 22.

The address decoder 22 is connected to a plurality of block select lines BLKSEL and a plurality of voltage select lines 33. For example, the address decoder 22 sequentially refers to a row address RA in the address register ADR (FIG. 2) in response to a control signal from the sequencer SQC.

The block select circuit 23 includes a plurality of block select circuits 34 corresponding to the memory blocks BLK. The block select circuits 34 each include a plurality of block select transistors 35 corresponding to the word lines WL and the select gate lines (SGD, SGS).

The block select transistor 35 is, for example, a field-effect type high breakdown voltage transistor. The block select transistors 35 have drain electrodes each electrically connected to the corresponding word line WL or the corresponding select gate line (SGD, SGS). The source electrodes of the block select transistors 35 are each electrically connected to a voltage supply line 31 via a wiring CG and the voltage select circuit 24. The gate electrodes of the block select transistors 35 are connected in common to the corresponding block select line BLKSEL.

The voltage select circuit 24 includes a plurality of voltage selectors 36 corresponding to the word lines WL and the select gate lines (SGD, SGS). Each of these plurality of voltage selectors 36 includes a plurality of voltage select transistors 37. The voltage select transistor 37 is, for example, a field-effect type high breakdown voltage transistor. The voltage select transistors 37 have drain terminals each electrically connected to the corresponding word line WL or the corresponding select gate line (SGD, SGS) via the wiring CG and the block select circuit 23. Each of the source terminals is electrically connected to the corresponding voltage supply line 31. Each of the gate electrodes is connected to the corresponding voltage select line 33.

[Configurations of Sense Amplifier Module SAM and Cache Memory CM]

As illustrated in FIG. 4, the sense amplifier module SAM includes a plurality of sense amplifier units SAU0 to SAU15 corresponding to the plurality of bit lines BL (for example, the 16 bit lines BL). Each of the plurality of sense amplifier units SAU0 to SAU15 includes a sense amplifier SA connected to the bit line BL, a wiring LBUS connected to the sense amplifier SA, and latch circuits SDL and DL0 to DL1 connected to the wiring LBUS. i is an integer of 1 or more.

The sense amplifier SA senses data read from the memory cell MC. The latch circuits SDL and DL0 to DL1 temporarily store the data sensed by the sense amplifier SA. The wiring LBUS is connected to a wiring DBUS via a switch transistor DSW.

As illustrated in FIG. 4, the cache memory CM (data register) is connected to the wiring DBUS. The cache memory CM includes a plurality of latch circuits XDL0 to XDL15 corresponding to the plurality of sense amplifier units SAU0 to SAU15. Each of the plurality of latch circuits XDL0 to XDL15 stores the data to be written to the memory cell MC or the data read from the memory cell MC. At a write operation, data DAT included in these plurality of latch circuits XDL0 to XDL15 are sequentially transferred to the latch circuits (for example, the latch circuits SDL) in the sense amplifier module SAM. At a read operation and a verify operation, the data included in the latch circuits SDL and DL0 to DL1 in the sense amplifier module SAM are sequentially transferred to the latch circuits XDL0 to XDL15. At a data-out operation, the data DAT included in the latch circuits XDL0 to XDL15 are sequentially transferred to the input/output control circuit I/O.

[Configuration of Counter CNT]

The counter CNT (FIG. 2) receives the data sequentially transferred from the latch circuits XDL0 to XDL15 in the cache memory CM. The number of bits indicating "0" or "1" among the bits included in the data is counted.

[Configuration of Voltage Generation Circuit VG]

For example, as illustrated in FIG. 3, the voltage generation circuit VG (FIG. 2) is connected to a plurality of the voltage supply lines 31. The voltage generation circuit VG includes, for example, a step down circuit, such as a regulator, and a step up circuit, such as a charge pump circuit 32. These step down circuit and step up circuit are each connected to the voltage supply line to which a power supply voltage $V_{CC}$ and a ground voltage $V_{SS}$ (FIG. 2) are applied. For example, the voltage generation circuit VG generates a plurality of operating voltages applied to the bit line BL, the source line SL, the word line WL, and the select gate lines (SGD, SGS) in the read operation, the write operation, and the erase operation on the memory cell array MCA in response to the control signal from the sequencer SQC to simultaneously output the operating voltages to the plurality of voltage supply lines 31. The operating voltage output from the voltage supply line 31 is appropriately adjusted in response to the control signal from the sequencer SQC.

[Configuration of Sequencer SQC]

In accordance with command data $D_{CMD}$ stored in the command register CMR, the sequencer SQC (FIG. 2) outputs an internal control signal to the row decoders RD, the sense amplifier module SAM, and the voltage generation circuit VG. The sequencer SQC appropriately outputs status data $D_{ST}$ indicative of the state of the memory die MD to the status register STR.

The sequencer SQC generates a ready/busy signal and outputs it to the terminal RY/(/BY). In a time while the terminal RY/(/BY) is in an "L" state (a busy period), access to the memory die MD is basically inhibited. In a time while the terminal RY/(/BY) is in an "H" state (a ready period), access to the memory die MD is permitted.

[Configuration of Address Register ADR]

As illustrated in FIG. 2, the address register ADR is connected to the input/output control circuit I/O and stores the address data $D_{ADD}$ input from the input/output control circuit I/O. For example, the address register ADR includes a plurality of 8-bit register strings. For example, when an internal operation, such as the read operation, the write operation, or the erase operation, is performed, the register string latches the address data $D_{ADD}$ corresponding to the internal operation in execution.

The address data $D_{ADD}$, for example, includes a column address CA (FIG. 2) and the row address RA (FIG. 2). For example, the row address RA includes a block address to identify the memory block BLK (FIG. 3), a page address to identify the string unit SU and the word line WL, a plane address to identify the memory cell array MCA (plane), and a chip address to identify the memory die MD.

[Configuration of Command Register CMR]

The command register CMR is connected to the input/output control circuit I/O and stores the command data $D_{CMD}$ input from the input/output control circuit I/O. For example, the command register CMR includes at least one set of an 8-bit register string. When the command data $D_{CMD}$ is stored in the command register CMR, the control signal is transmitted to the sequencer SQC.

[Configuration of Status Register SIR]

The status register STR is connected to the input/output control circuit I/O and stores the status data $D_{ST}$ output to the input/output control circuit I/O. For example, the status register STR includes a plurality of 8-bit register strings. For example, when the internal operation, such as the read operation, the write operation, or the erase operation, is performed, the register string latches the status data $D_{ST}$ regarding the internal operation in execution. The register string, for example, latches ready/busy information of the memory cell array MCA.

[Configuration of Input/Output Control Circuit I/O]

The input/output control circuit I/O (FIG. 2) includes data signal input/output terminals DQ0 to DQ7, data strobe signal input/output terminals DQS, /DQS, a shift register, and a buffer circuit.

The data input via the data signal input/output terminals DQ0 to DQ7 is input to the cache memory CM, the address register ADR, or the command register CMR from the buffer circuit in response to the internal control signal from the logic circuit CTR. The data output via the data signal input/output terminals DQ0 to DQ7 is input to the buffer circuit from the cache memory CM or the status register STR in response to the internal control signal from the logic circuit CTR.

The signals input via the data strobe signal input/output terminals DQS, /DQS (for example, a data strobe signal and its complementary signal) are used at data input via the data signal input/output terminals DQ0 to DQ7. The data input via the data signal input/output terminals DQ0 to DQ7 are taken in the shift register in the input/output control circuit I/O at a timing of a voltage rise edge (switching of the input signal) of the data strobe signal input/output terminal DQS and a voltage fall edge (switching of the input signal) of the data strobe signal input/output terminal /DQS, and at a timing of a voltage fall edge (switching of the input signal) of the data strobe signal input/output terminal DQS and a voltage rise edge (switching of the input signal) of the data strobe signal input/output terminal /DQS.

[Configuration of Logic Circuit CTR]

The logic circuit CTR (FIG. 2) includes a plurality of external control terminals /CE, CLE, ALE, /WE, /RE, RE and a logic circuit connected to these plurality of external control terminals /CE, CLE, ALE, /WE, /RE, RE. The logic circuit CTR receives an external control signal from the controller die CD via the external control terminals /CE, CLE, ALE, /WE, /RE, RE and outputs the internal control signal to the input/output control circuit I/O in response to this.

[Structure of Memory Die MD]

Figure 5:
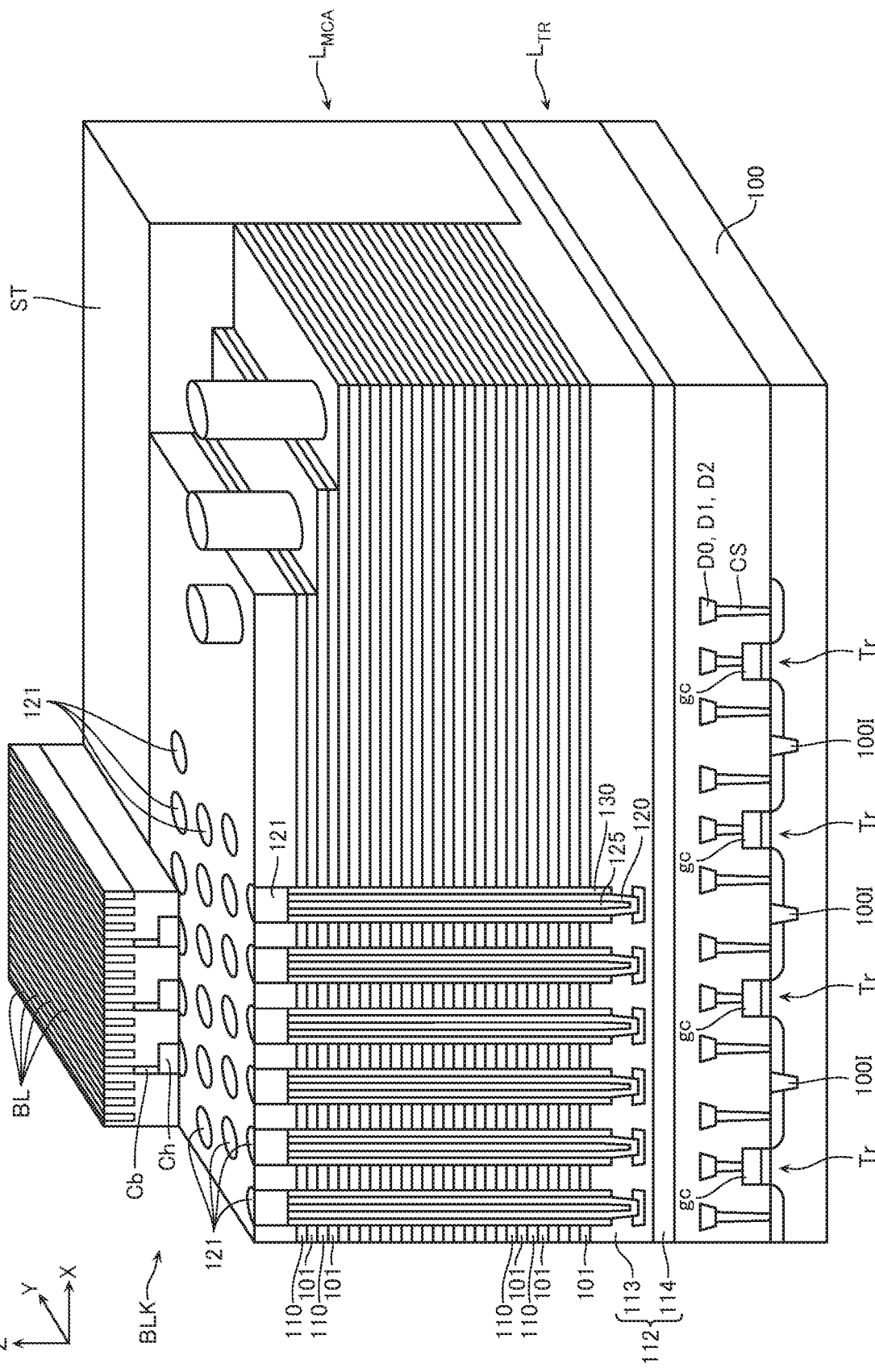
FIG. 5 is a schematic perspective view illustrating a configuration of a part of the memory die MD.
Figure 6:
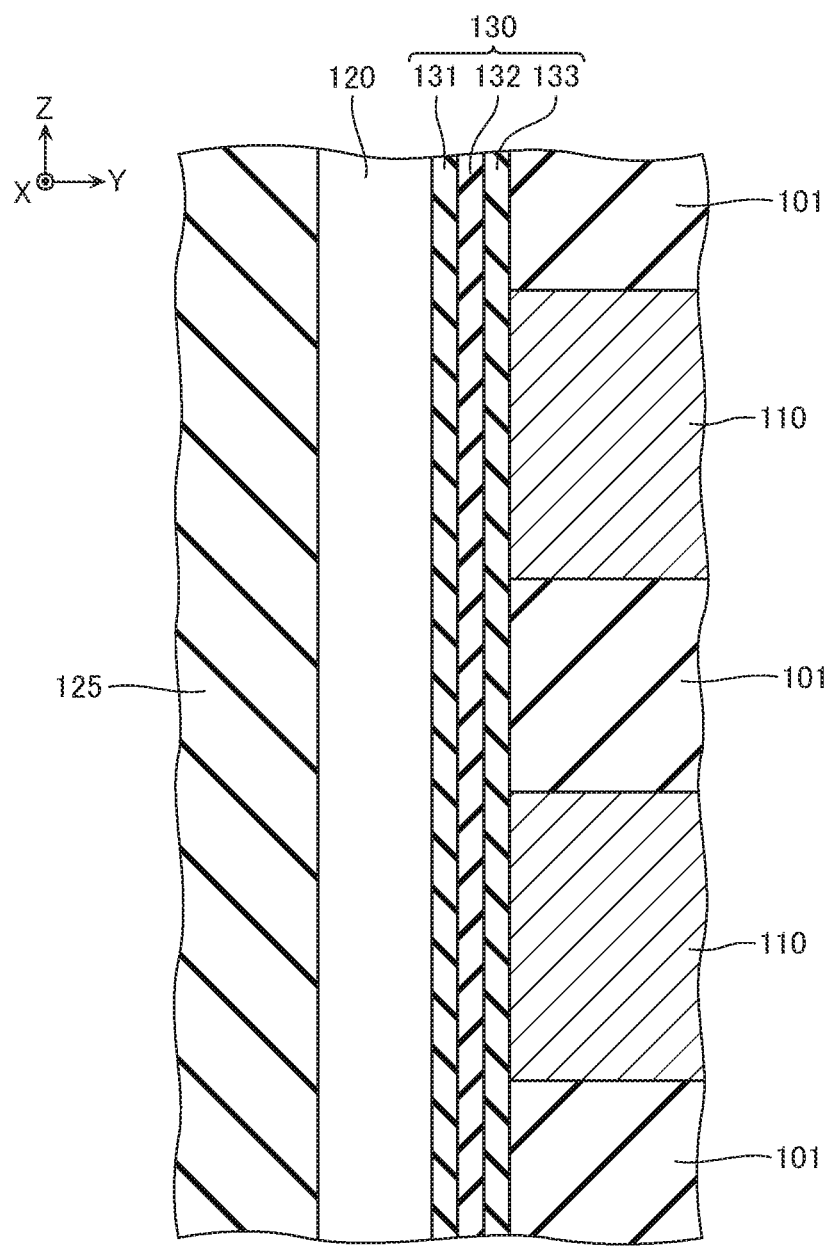
FIG. 6 is a schematic enlarged view illustrating a configuration of a part of FIG. 5.

FIG. 5 is a schematic perspective view illustrating a configuration of a part of the memory die MD. FIG. 6 is a schematic enlarged view illustrating a configuration of a part of FIG. 5. Note that FIG. 5 and FIG. 6 illustrate a schematic configuration and a specific configuration is appropriately changeable. Additionally, FIG. 5 and FIG. 6 omit a part of a configuration.

As illustrated in FIG. 5, the memory die MD includes a semiconductor substrate 100, a transistor layer $L_{TR}$ disposed on the semiconductor substrate 100, and a memory cell array layer $L_{MCA}$ disposed above the transistor layer $L_{TR}$.

[Structure of Semiconductor Substrate 100]

For example, the semiconductor substrate 100 includes single-crystal silicon (Si) or the like containing P-type impurities. On a part of a surface of the semiconductor substrate 100, an N-type well containing N-type impurities, such as phosphorus (P), is disposed. On a part of a surface of the N-type well, a P-type well containing P-type impurities, such as boron (B), is disposed. On a part of the surface of the semiconductor substrate 100, an insulating region 1001 is disposed.

[Structure of Transistor Layer $L_{TR}$]

The transistor layer $L_{TR}$ includes a plurality of transistors Tr constituting the peripheral circuit PC. A source region, a drain region, and a channel region of the transistor Tr are disposed on the surface of the semiconductor substrate 100. The transistor Tr includes a gate electrode gc disposed in the transistor layer $L_{TR}$. At the source regions, the drain regions, and the gate electrodes gc of these plurality of transistors Tr, contacts CS are disposed. These plurality of contacts CS are connected to other transistors Tr, the configurations in the memory cell array layer $L_{MCA}$, and the like via wirings D0, D1, D2 in the transistor layer $L_{TR}$.

[Structure of Memory Cell Array Layer $L_{MCA}$]

The memory cell array layer $L_{MCA}$ includes a plurality of memory blocks BLK and a plurality of inter-block structures ST alternately arranged in the Y-direction. The memory block BLK includes a plurality of conductive layers 110 and a plurality of insulating layers 101 alternately arranged in the Z-direction, a plurality of semiconductor columns 120 extending in the Z-direction, and a plurality of gate insulating films 130 each disposed between the plurality of conductive layers 110 and the plurality of semiconductor columns 120.

The conductive layer 110 is an approximately plate-shaped conductive layer extending in the X-direction, and a plurality of the conductive layers 110 are arranged in the Z-direction. The conductive layer 110 may include, for example, a stacked film of titanium nitride (TiN) and tungsten (W), and may contain polycrystalline silicon or the like containing impurities such as phosphorus or boron.

Among the plurality of conductive layers 110, one or plurality of conductive layers 110 positioned at the lowermost layer function as the source-side select gate lines SGS (FIG. 3) and gate electrodes of the plurality of source-side select transistors STS connected to the source-side select gate lines SGS. A plurality of conductive layers 110 positioned thereabove function as the word lines WL (FIG. 3) and gate electrodes of the plurality of memory cells MC (FIG. 3) connected to the word lines WL. One or plurality of conductive layers 110 positioned thereabove function as the drain-side select gate line SGD and gate electrodes of the plurality of drain-side select transistors STD (FIG. 3) connected to the drain-side select gate line SGD.

A conductive layer 112 is disposed below the conductive layers 110. The conductive layer 112 includes a semiconductor layer 113 connected to lower ends of the semiconductor columns 120, and a conductive layer 114 connected to a lower surface of the semiconductor layer 113. The semiconductor layer 113 may contain, for example, polycrystalline silicon containing impurities such as phosphorus (P) or boron (B). The conductive layer 114 may include, for example, a metal, such as tungsten (W), a conductive material, such as tungsten silicide, or another conductive material. An insulating layer 101 of silicon oxide ($SiO_2$) or the like is disposed between the conductive layer 112 and the conductive layer 110.

The conductive layer 112 functions as the source line SL (FIG. 3). The source line SL is disposed, for example, in common to all of the memory blocks BLK included in the memory cell array MCA (FIG. 3).

A plurality of the semiconductor columns 120 are arranged in the X-direction and the Y-direction. The semiconductor column 120 is, for example, a semiconductor film of non-doped polycrystalline silicon (Si) or the like. The semiconductor column 120 has an approximately cylindrical shape, and includes an insulating film 125 of silicon oxide or the like in the center portion. Each of the semiconductor columns 120 has an outer peripheral surface surrounded by the conductive layers 110. A lower end portion of the semiconductor column 120 is connected to the semiconductor layer 113 of the conductive layer 112. An upper end portion of the semiconductor column 120 is connected to the bit line BL via an impurity region 121 containing N-type impurities such as phosphorus (P) and contacts Ch, Cb. The respective semiconductor columns 120 function as the channel regions of the plurality of memory cells MC and the select transistors STD, STS included in one memory string MS (FIG. 3).

For example, as illustrated in FIG. 6, the gate insulating film 130 includes a tunnel insulating film 131, an electric charge accumulating film 132, and a block insulating film 133 stacked between the semiconductor column 120 and the conductive layers 110. The tunnel insulating film 131 and the block insulating film 133 are, for example, insulating films, such as silicon oxide. The electric charge accumulating film 132 is, for example, a film of silicon nitride (SiN) or the like that can accumulate electric charge. The tunnel insulating film 131, the electric charge accumulating film 132, and the block insulating film 133 have approximately cylindrical shapes, and extend in the Z-direction along the outer peripheral surface of the semiconductor column 120.

While FIG. 6 illustrates an example in which the gate insulating film 130 includes the electric charge accumulating film 132 of silicon nitride or the like, the gate insulating film 130 may include, for example, a floating gate of polycrystalline silicon or the like containing N-type or P-type impurities.

For example, as illustrated in FIG. 5, the inter-block structure ST extends in the X-direction and the Z-direction. For example, the inter-block structure ST may include an insulating layer of silicon oxide ($SiO_2$) or the like. The inter-block structure ST may include, for example, a conductive layer that extends in the X-direction and the Z-direction and is connected to the conductive layer 112, and insulating layers of silicon oxide ($SiO_2$) or the like disposed on both side surfaces in the Y-direction of this conductive layer.

[Threshold Voltage of Memory Cell MC Storing a Plurality of Bits]

Figures 7A, 7B, 7C:
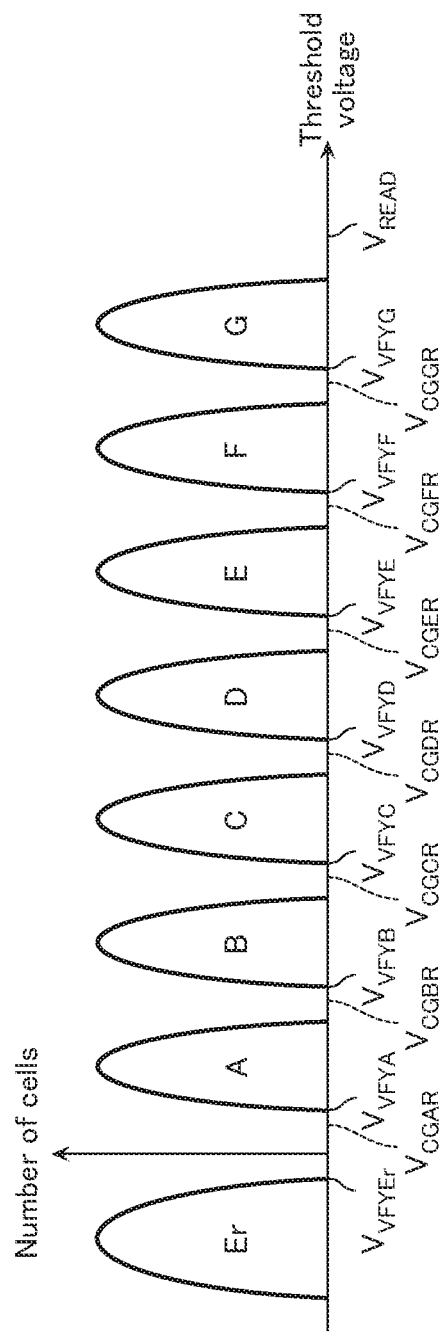
FIG. 7A is a schematic histogram for describing a threshold voltage of a memory cell MC storing three-bit data.
FIG. 7B is a table showing an example of a relationship between the threshold voltage of the memory cell MC storing the three-bit data and stored data.
FIG. 7C is a table showing another example of the relationship between the threshold voltage of the memory cell MC storing the three-bit data and the stored data.

Next, with reference to FIG. 7A to FIG. 7C, the threshold voltage of the memory cell MC storing data of a plurality of bits will be described. FIG. 7A to FIG. 7C illustrate the threshold voltage of the memory cell MC storing three-bit data as an example.

FIG. 7A is a schematic histogram for describing the threshold voltage of the memory cell MC storing the three-bit data. The horizontal axis indicates the voltage of the word line WL, and the vertical axis indicates the number of memory cells MC. FIG. 7B is a table showing an example of a relationship between the threshold voltage of the memory cell MC storing the three-bit data and the stored data. FIG. 7C is a table showing another example of the relationship between the threshold voltage of the memory cell MC storing the three-bit data and the stored data.

In the example of FIG. 7A, the threshold voltages of the memory cells MC are controlled in eight states. The threshold voltage of the memory cell MC controlled in a state Er is smaller than an erase verify voltage $V_{VFYEr}$. For example, the threshold voltage of the memory cell MC controlled in a state A is larger than a verify voltage $V_{VFYA}$ and smaller than a verify voltage $V_{VFYB}$. Additionally, for example, the threshold voltage of the memory cell MC controlled in a state B is larger than the verify voltage $V_{VFYB}$ and smaller than a verify voltage $V_{VFYC}$. Hereinafter, similarly, the threshold voltages of the memory cells MC controlled in a state C to a state F are larger than the verify voltage $V_{VFYC}$ to a verify voltage $V_{VFYF}$ and smaller than a verify voltage $V_{VFYD}$ to a verify voltage $V_{VFYG}$, respectively. For example, the threshold voltage of the memory cell MC controlled in a state G is larger than the verify voltage $V_{VFYG}$ and smaller than a read pass voltage $V_{READ}$. The read pass voltage $V_{READ}$ is, for example, a voltage around 9 V.

In the example in FIG. 7A, a read voltage $V_{CGAR}$ is set between a threshold distribution corresponding to the state Er and a threshold distribution corresponding to the state A. A read voltage $V_{CGBR}$ is set between the threshold distribution corresponding to the state A and a threshold distribution corresponding to the state B. Hereinafter, similarly, a read voltage $V_{CGCR}$ to a read voltage $V_{CGGR}$ are set from a voltage between the threshold distribution corresponding to the state B and a threshold distribution corresponding to the state C to a voltage between a threshold distribution corresponding to the state F and a threshold distribution corresponding to the state G, respectively.

For example, the state Er corresponds to the lowest threshold voltage. The memory cell MC in the state Er is, for example, in an erase state. For example, data "111" is assigned to the memory cell MC in the state Er.

The state A corresponds to the threshold voltage higher than the threshold voltage corresponding to the state Er. For example, data "101" is assigned to the memory cell MC in the state A.

The state B corresponds to the threshold voltage higher than the threshold voltage corresponding to the state A. For example, data "001" is assigned to the memory cell MC in the state B.

Hereinafter, similarly, the state C to the state G in the drawing correspond to threshold voltages higher than the threshold voltages corresponding to the state B to the state F. For example, data "011", "010", "110", "100", and "000" are assigned to the memory cells MC in these states.

In the case of the assignment as exemplified in FIG. 7B, the data of a lower bit is distinguishable with one read voltage $V_{CGDR}$. The data of a middle bit is distinguishable with three read voltages $V_{CGAR}$, $V_{CGCR}$, $V_{CGER}$. The data of an upper bit is distinguishable with three read voltages $V_{CGBR}$, $V_{CGER}$, $V_{CGGR}$. This assignment of data is referred to as a 1-3-3 code in some cases.

The number of bits of the data stored in the memory cell MC, the number of states, the assignment of the data to each state, and the like are changeable as necessary.

For example, in the case of the assignment as exemplified in FIG. 7C, the data of the lower bit is distinguishable with one read voltage $V_{CGDR}$. The data of the middle bit is distinguishable with the two read voltages $V_{CGBR}$, $V_{CGFR}$. The data of the upper bit is distinguishable with the four read voltages $V_{CGAR}$, $V_{CGCR}$, $V_{CGER}$, $V_{CGGR}$. This assignment of data is referred to as a 1-2-4 code in some cases.

[Write Operation]

Next, the write operation of the semiconductor memory device according to the embodiment will be described.

Figure 8:
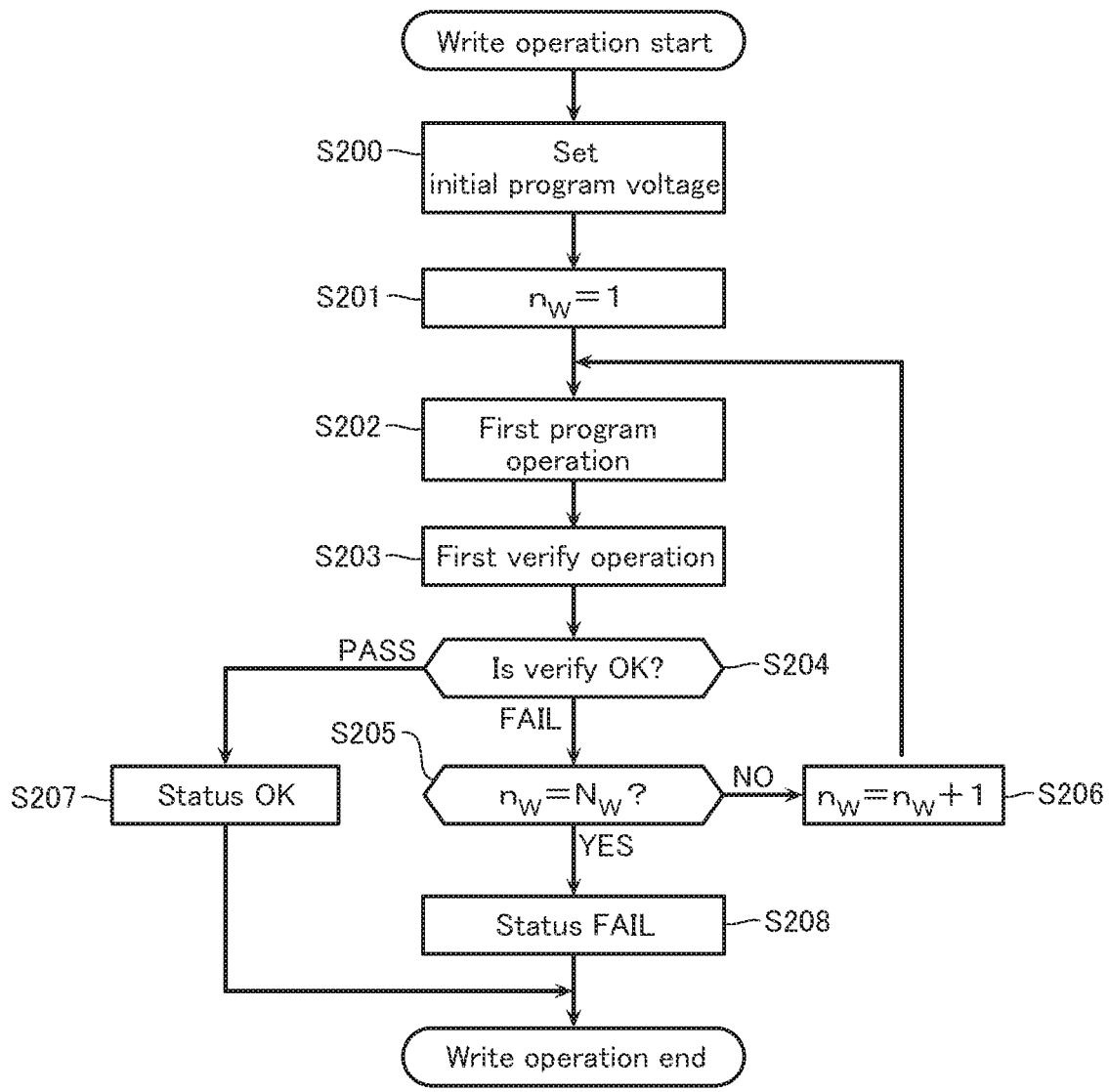
FIG. 8 is a flowchart for describing a write operation of the first embodiment.
Figure 9:
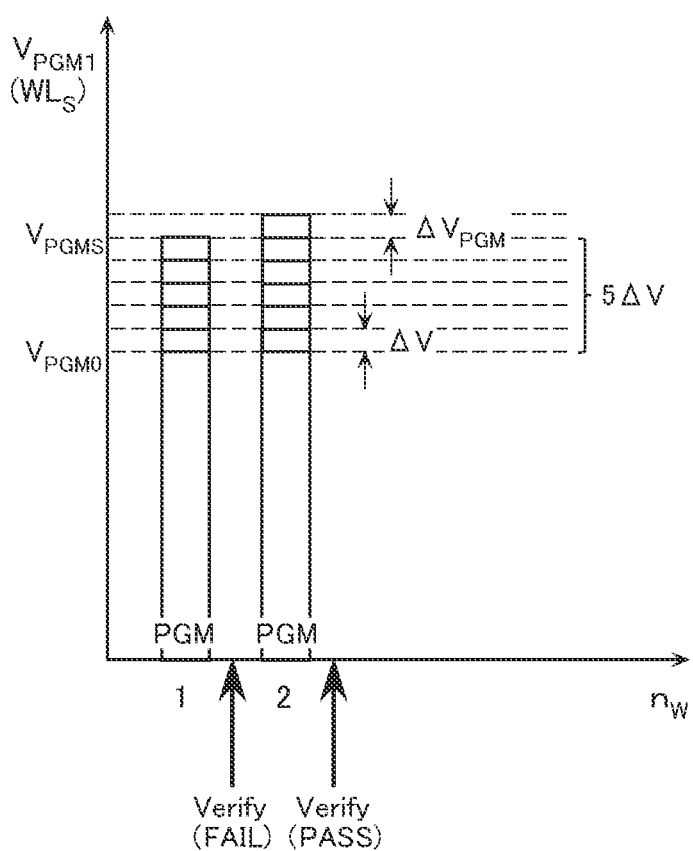
FIG. 9 is a drawing for describing a relationship between a loop count $n_W$ and a program voltage $V_{PGM1}$.
Figure 10:
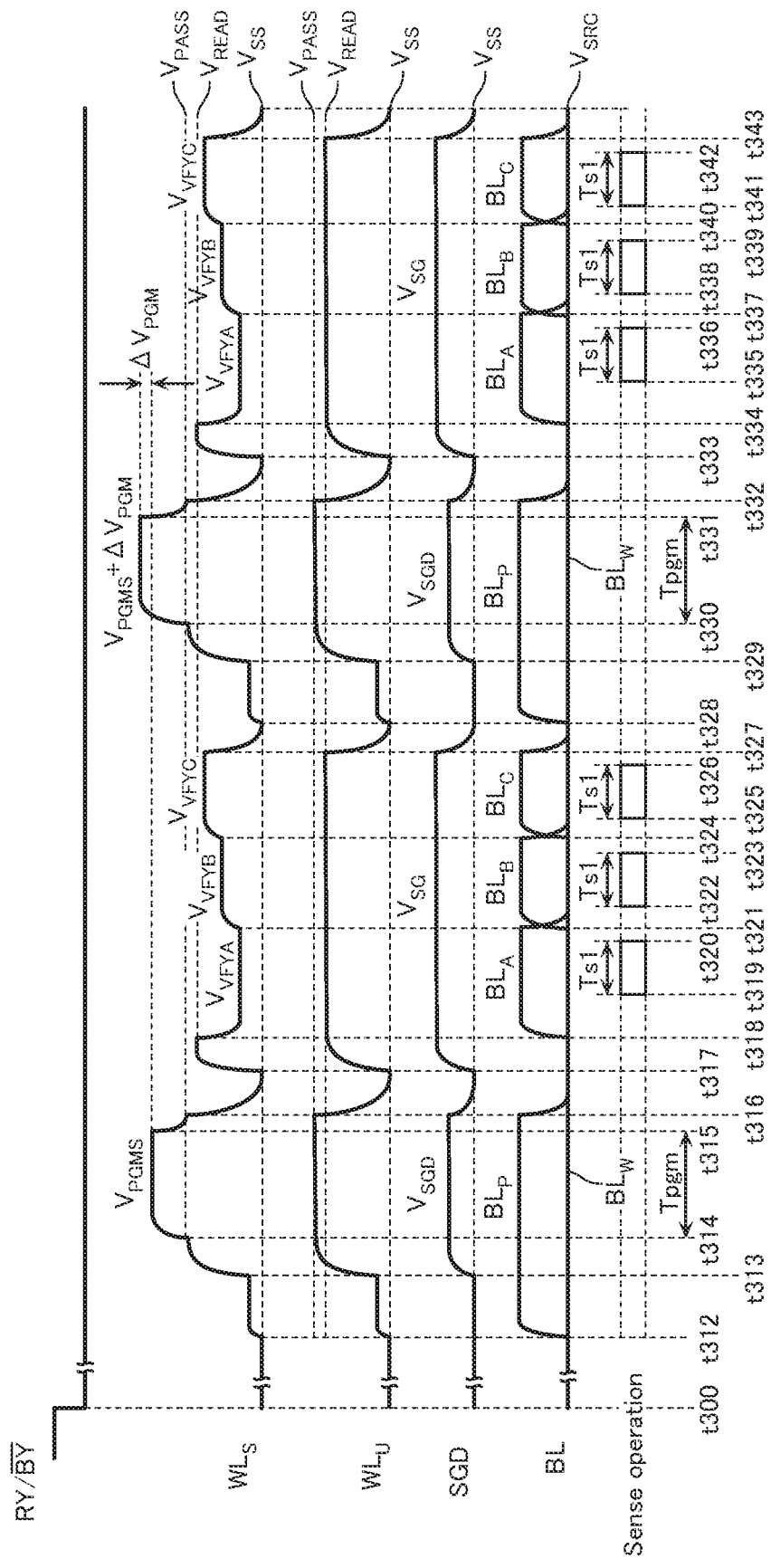
FIG. 10 is a timing chart for describing a first program operation and a first verify operation.
Figure 11:
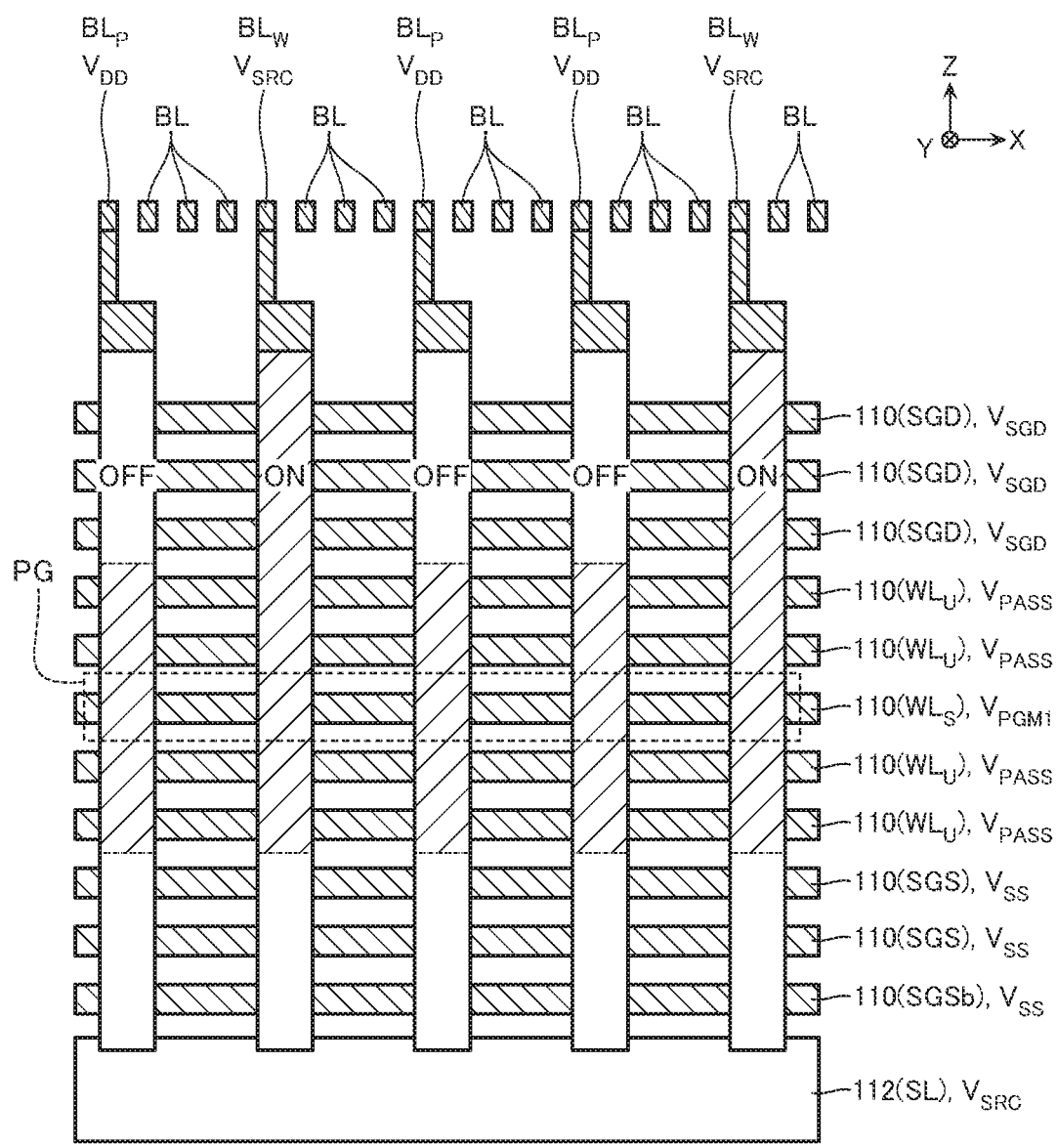
FIG. 11 is a schematic cross-sectional view for describing the first program operation.
Figure 12:
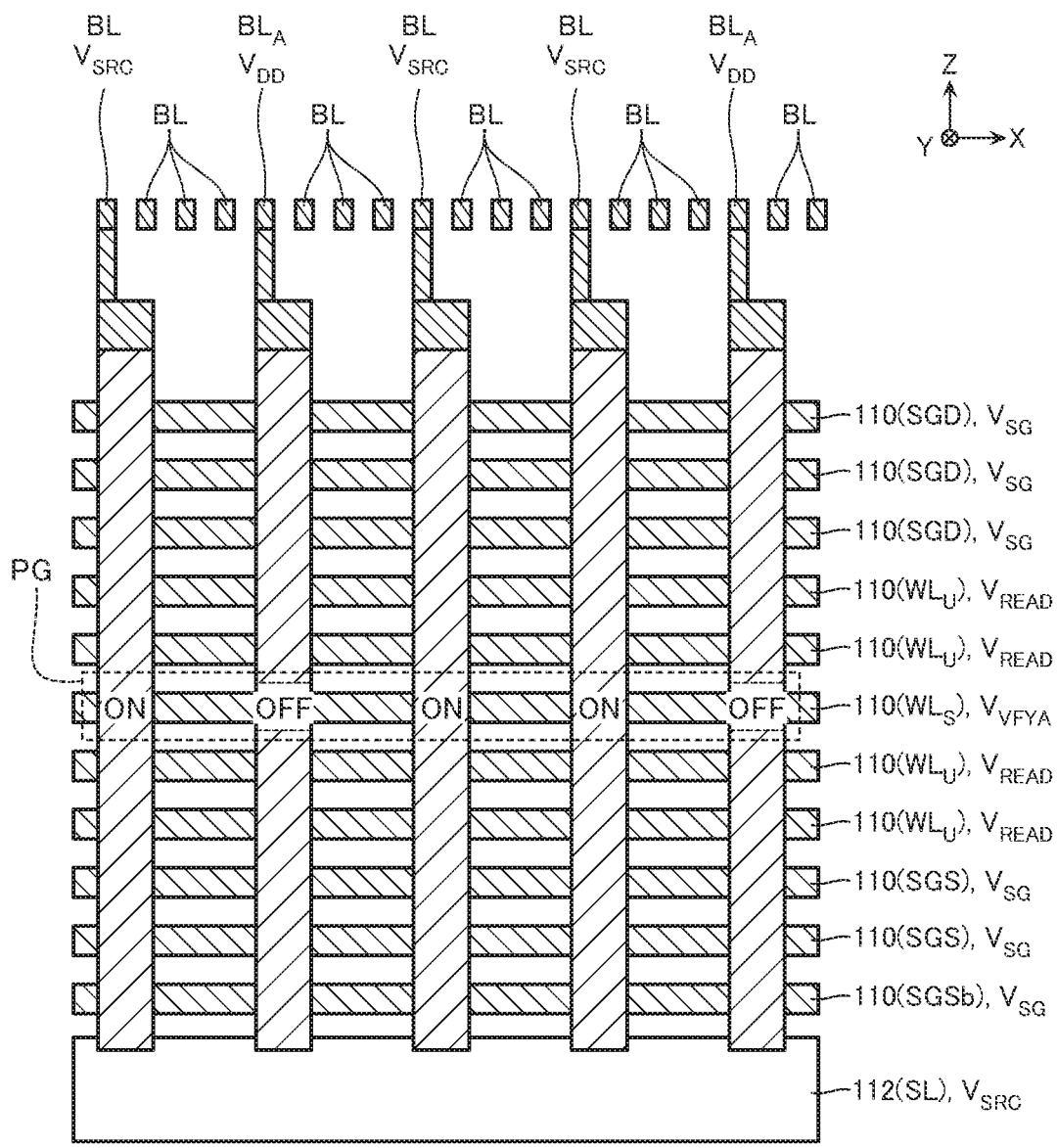
FIG. 12 is a schematic cross-sectional view for describing the first verify operation.

FIG. 8 is a flowchart for describing the write operation of the first embodiment. FIG. 9 is a drawing for describing a relationship between a loop count $n_W$ and a program voltage $V_{PGM1}$. FIG. 10 is a timing chart for describing a first program operation and a first verify operation. FIG. 11 is a schematic cross-sectional view for describing the first program operation. FIG. 12 is a schematic cross-sectional view for describing the first verify operation.

Note that, in the following description, the word line WL as an operation target is referred to as a selected word line $WL_S$, and other word lines WL are referred to as unselected word lines $WL_U$ in some cases. In the following description, among the plurality of memory cells MC included in the string unit SU as an operation target, one connected to the selected word line $WL_S$ is referred to as a "selected memory cell MC" in some cases. In the following description, the configuration including such a plurality of the selected memory cells MC is referred to as a selected page PG in some cases.

In the following description, an example where the write operation is performed on the plurality of selected memory cells MC corresponding to the selected page PG will be described.

The write operation includes a plurality of first write loops. Each of the first write loops includes an operation to increase the threshold voltage of the memory cell MC (Steps S202 and the like in FIG. 8 described later) and an operation to confirm the threshold voltage of the memory cell MC (Step S203 and the like in FIG. 8 described later). The same applies to the first write loops in the write operations of a third embodiment and a fourth embodiment.

At Step S200, an initial program voltage $V_{PGMS}$ (FIG. 9) is set. The initial program voltage $V_{PGMS}$ is a voltage at an initial value of the program voltage $V_{PGM1}$ in the first program operation (Step S202). The initial program voltage $V_{PGMS}$ is obtained in a program voltage control operation (Steps S101 to S109 in FIG. 13) described later (Step S106 in FIG. 13).

At Step S201, a loop count $n_W$ is set to 1. The loop count $n_W$ is a variable indicative of the number of times of the first write loop. At Step S201, for example, data to be written to the memory cell MC is latched in the latch circuits DL0 to DLi in a sense amplifier unit SAU (FIG. 4). Operations at Steps S200, S201 are performed, for example, at timing t300 in FIG. 10.

At Step S202, the first program operation is performed. The first program operation is an operation that applies the program voltage $V_{PGM1}$ to the selected word line $WL_S$ and increases the threshold voltage of the memory cell MC. In the example of FIG. 10, the operation is performed in a period from timing t312 until timing t316 and a period from timing t328 until timing t332.

In the first program operation, for example, as illustrated in FIG. 10 and FIG. 11, among the plurality of selected memory cells MC, a voltage $V_{SRC}$ is applied to a bit line $BL_W$ connected to the selected memory cell MC whose threshold voltage is adjusted. Additionally, among the plurality of selected memory cells MC, a voltage $V_{DD}$ is applied to a bit line $BL_P$ connected to the selected memory cell MC whose threshold voltage is not adjusted. Hereinafter, the selected memory cell MC on which the adjustment of the threshold voltage is performed among the plurality of selected memory cells MC is referred to as a "write memory cell MC" and the selected memory cell MC on which the adjustment of the threshold voltage is not performed is referred to as an "inhibited memory cell MC" in some cases. The voltage $V_{SRC}$ may be larger than the ground voltage $V_{SS}$ or may be equal to the ground voltage $V_{SS}$. The voltage $V_{DD}$ is larger than the voltage $V_{SRC}$.

Additionally, at the first program operation, for example, as illustrated in FIG. 10 and FIG. 11, a voltage $V_{SGD}$ is applied to the drain-side select gate lines SGD.

The voltage $V_{SGD}$ is larger than the voltage $V_{SRC}$. Additionally, a voltage difference between the voltage $V_{SGD}$ and the voltage $V_{SRC}$ is larger than a threshold voltage when the drain-side select transistor STD is caused to function as an NMOS transistor. Therefore, an electron channel is formed in a channel region of the drain-side select transistor STD connected to the bit line $BL_W$, and the voltage $V_{SRC}$ is transferred to the channel region of the drain-side select transistor STD connected to the bit line $BL_W$.

On the other hand, a voltage difference between the voltage $V_{SGD}$ and the voltage $V_{DD}$ is smaller than the threshold voltage when the drain-side select transistor STD is caused to function as an NMOS transistor. Therefore, the drain-side select transistor STD connected to the bit line $BL_P$ enters an OFF state.

Additionally, in the first program operation, for example, as illustrated in FIG. 11, the voltage $V_{SRC}$ is applied to the source line SL, and the ground voltage $V_{SS}$ is applied to the source-side select gate lines SGS, SGSb. Accordingly, the source-side select transistors STS, STSb enter the OFF state.

Additionally, in the first program operation, for example, as illustrated in FIG. 10 and FIG. 11, a write pass voltage $V_{PASS}$ is applied to the unselected word lines $WL_U$. The write pass voltage $V_{PASS}$ is larger than the read pass voltage $V_{READ}$, which has been described with reference to FIG. 7A to FIG. 7C. The write pass voltage $V_{PASS}$ is, for example, a voltage around 10 V. Additionally, a voltage difference between the write pass voltage $V_{PASS}$ and the voltage $V_{SRC}$ is larger than a threshold voltage when the memory cell MC is caused to function as the NMOS transistor regardless of the data stored in the memory cell MC. Therefore, an electron channel is formed in the channel region of the unselected memory cell MC, and the voltage $V_{SRC}$ is transferred to the write memory cell MC.

In the first program operation, for example, as illustrated in FIG. 10 and FIG. 11, the program voltage $V_{PGM1}$ is applied to the selected word line $WL_S$. The program voltage $V_{PGM1}$ is larger than the write pass voltage $V_{PASS}$.

FIG. 9 illustrates an example of performing the first program operation in the first write loop at the second time. In the first program operation (a time Tpgm from timing t314 until timing t315 in FIG. 10) in the first write loop at the first time (loop count $n_W$=1), the initial program voltage $V_{PGMS}$ is applied to the selected word line $WL_S$. As described above, the initial program voltage $V_{PGMS}$ is a voltage set as the initial value of the program voltage $V_{PGM1}$ at Step S200. Additionally, in the first program operation (a time Tpgm from timing t330 until timing t331 in FIG. 10) in the first write loop at the second time (loop count $n_W$=2), a voltage ($V_{PGMS}+\Delta V_{PGM}$) found by adding an offset voltage $\Delta V_{PGM}$ to the initial program voltage $V_{PGMS}$ is applied to the selected word line $WL_S$ as the program voltage $V_{PGM1}$.

Here, the voltage $V_{SRC}$ is applied to the channel of the semiconductor column 120 connected to the bit line $BL_W$. A comparatively large electric field is generated between the semiconductor column 120 and the selected word line $WL_S$. This causes the electrons in the channel of the semiconductor column 120 to tunnel into the electric charge accumulating film 132 (FIG. 6) via the tunnel insulating film 131 (FIG. 6). This increases the threshold voltage of the write memory cell MC.

Additionally, the channel of the semiconductor column 120 connected to the bit line $BL_P$ is in an electrically floating state, and this channel voltage is increased up to approximately the write pass voltage $V_{PASS}$ by capacitive coupling with the unselected word line $WL_U$. Between such a semiconductor column 120 and the selected word line $WL_S$, an electric field smaller than the above-described electric field is generated. Accordingly, the electrons in the channel of the semiconductor column 120 do not tunnel into the electric charge accumulating film 132 (FIG. 6). Accordingly, the threshold voltage of the memory cell MC is not increased.

At Step S203 (FIG. 8), the first verify operation is performed. The first verify operation is an operation for applying a verify voltage $V_{VFY}$ to the selected word line $WL_S$, detecting the ON state/OFF state of the memory cell MC, and detecting whether the threshold voltage of the memory cell MC reaches the target value or not. In the example of FIG. 10, this operation is performed in a period from timing t317 until timing t327 and a period from timing t333 until timing t343.

For example, as illustrated in FIG. 10 and FIG. 12, in the first verify operation, in a period from timing t318 until timing t321, based on the data in the latch circuits DL0 to DL1, the voltage $V_{DD}$ is applied to the bit lines BL (bit lines $BL_A$ in the example of FIG. 10 and FIG. 12) connected to the memory cells MC corresponding to a specific state (the state A in the example of FIG. 10 and FIG. 12), and the voltage $V_{SRC}$ is applied to the other bit lines BL. Additionally, the voltage $V_{SRC}$ is applied to the source line SL. Additionally, in the first verify operation, in a period from timing t321 until timing t324, the voltage $V_{DD}$ is applied to a bit line $BL_B$ connected to the memory cell MC corresponding to the state B, and in a period from timing t324 until timing t327, the voltage $V_{DD}$ is applied to a bit line $BL_C$ connected to the memory cell MC corresponding to the state C.

In the first verify operation, for example, as illustrated in FIG. 10 and FIG. 12, a voltage $V_{SG}$ is applied to the drain-side select gate lines SGD. The voltage $V_{SG}$ is larger than the voltage $V_{DD}$. A voltage difference between the voltage $V_{SG}$ and the voltage $V_{DD}$ is larger than the threshold voltage when the drain-side select transistor STD is caused to function as the NMOS transistor. Therefore, an electron channel is formed in a channel region of the drain-side select transistor STD, and the voltage $V_{DD}$ is transferred to a channel region of the drain-side select transistor STD.

In the first verify operation, for example, as illustrated in FIG. 12, the voltage $V_{SG}$ is applied to the source-side select gate lines SGS, SGSb. The voltage $V_{SG}$ is larger than the voltage $V_{SRC}$. A voltage difference between the voltage $V_{SG}$ and the voltage $V_{SRC}$ is larger than the threshold voltages when the source-side select transistors STS, STSb are caused to function as the NMOS transistors. Therefore, electron channels are formed in channel regions of the source-side select transistors STS, STSb, and the voltage $V_{SRC}$ is transferred to the channel regions of the source-side select transistors STS, STSb.

In the first verify operation, for example, as illustrated in FIG. 10 and FIG. 12, the read pass voltage $V_{READ}$ is applied to the unselected word lines $WL_U$. The read pass voltage $V_{READ}$ is larger than the voltages $V_{DD}$, $V_{SRC}$. Voltage differences between the read pass voltage $V_{READ}$ and the voltages $V_{DD}$, $V_{SRC}$ are larger than the threshold voltage when the memory cell MC is caused to function as the NMOS transistor regardless of the data stored in the memory cell MC. Accordingly, electron channels are formed in the channel regions of the unselected memory cells MC, and the voltages $V_{DD}$, $V_{SRC}$ are transferred to the selected memory cells MC.

Additionally, in the first verify operation, for example, as illustrated in FIG. 10 and FIG. 12, the read pass voltage $V_{READ}$ is applied to the selected word line $WL_S$ in a period from timing t317 until timing t318. Afterwards, the verify voltage $V_{VFY}$ is applied to the selected word line $WL_S$. The verify voltage $V_{VFY}$ is smaller than the read pass voltage $V_{READ}$. The verify voltage $V_{VFY}$ is any of the verify voltages $V_{VFYA}$ to $V_{VFYG}$ described with reference to FIG. 7A to FIG. 7C. In the example of FIG. 10, in a period from timing t318 until timing t321, the verify voltage $V_{VFY}$ is the verify voltage $V_{VFYA}$ corresponding to the state A. Additionally, in a period from timing t321 until timing t324, the verify voltage $V_{VFY}$ is the verify voltage $V_{VFYB}$ corresponding to the state B. Additionally, in a period from timing t324 until timing t327, the verify voltage $V_{VFY}$ is the verify voltage $V_{VFYC}$ corresponding to the state C.

Thus, as illustrated in FIG. 12, the memory cells MC having the threshold voltages equal to or less than the verify voltage $V_{VFYA}$ become the ON state, and the memory cells MC having the threshold voltages larger than the verify voltage $V_{VFYA}$ become the OFF state. Similarly, the memory cells MC having the threshold voltages equal to or less than the verify voltages $V_{VFYB}$, $V_{VFYC}$ become the ON state, and the memory cells MC having the threshold voltages larger than the verify voltages $V_{VFYB}$, $V_{VFYC}$ become the OFF state. The ON states/OFF states of these memory cells MC are detected by the sense amplifier module SAM (FIG. 4) via the bit lines $BL_A$, $BL_B$, $BL_C$, thus obtaining the data indicating the states of these memory cells MC. This operation is referred to as a "sense operation".

In the sense operation, for example, in a state of applying the voltage $V_{DD}$ to the bit line BL, a sense node of the sense amplifier SA (FIG. 4) is electrically conducted with the bit line BL. After performing the sense operation, the sense node is electrically separated from the bit line BL. The electric charge of the wiring LBUS is discharged or maintained corresponding to the state of the sense node. Any of the latch circuits in the sense amplifier unit SAU is electrically conducted with the wiring LBUS, and the data of the wiring LBUS is latched by this latch circuit.

In the example of FIG. 10, the sense amplifier SA electrically conducts the bit line $BL_A$ and the sense node in a period from timing t319 until timing t320. Additionally, the sense amplifier SA electrically conducts the bit line $BL_B$ and the sense node in a period from timing t322 until timing t323. Additionally, the sense amplifier SA electrically conducts the bit line $BL_C$ and the sense node in a period from timing t325 until timing t326. The time during which the bit line BL and the sense node are electrically conducted, such as the period from timing t319 until timing t320, the period from timing t322 until timing t323, and the period from timing t325 until timing t326, is referred to as a sense time Ts1 in some cases.

The data indicative of the ON state/OFF state of the memory cell MC is transferred to the latch circuits XDL0 to XDL15 (FIG. 4) of the cache memory CM via the wiring LBUS, the switch transistor DSW, and the wiring DBUS (FIG. 4). In each of the plurality of latch circuits XDL0 to XDL15 in the cache memory CM, data indicative of the ON states/OFF states of the memory cells MC corresponding to the plurality of bit lines BL are stored.

For example, when the selected memory cell MC corresponding to one bit line BL is in the ON state, data "1" is stored in the latch circuit XDL corresponding to the bit line BL. The data "1" indicates that data has not been normally written in the selected memory cell MC corresponding to one bit line BL (that is, the threshold voltage of the selected memory cell MC does not reach a target value). Hereinafter, the bit of the data "1" is referred to as a bit of verify FAIL in some cases.

For example, when the selected memory cell MC corresponding to one bit line BL is in the OFF state, data"0" is stored in the latch circuit XDL corresponding to the bit line BL. The data "0" indicates that data has been normally written in the selected memory cell MC corresponding to the bit line BL (that is, the threshold voltage of the selected memory cell MC reaches the target value). Hereinafter, the bit of the data "0" is referred to as a bit of verify PASS in some cases.

At Step S204 (FIG. 8), the result of the first verify operation is determined. For example, data (hereinafter referred to as first verify data in some cases) obtained by the first verify operation at Step S203 is sequentially transferred from the latch circuits XDL0 to XDL15 to the counter CNT (FIG. 2). The counter CNT counts the number of bits of verify FAIL (the number of bits of the data "1") among the first verify data. The number of bits of verify FAIL is counted, for example, at the end of Step S203. The sequencer SQC determines whether the number of bits of verify FAIL in the first verify data is less than a first reference value Cr1 or not.

When the number of bits of verify FAIL in the first verify data is less than the first reference value Cr1, the sequencer SQC determines it as verify PASS, and the process proceeds to Step S207. On the other hand, when the number of bits of verify FAIL in the first verify data is the first reference value Cr1 or more, the sequencer SQC determines it as verify FAIL, and the process proceeds to Step S205.

Note that in the example of FIG. 9, it is determined as verify FAIL in the first write loop at the first time (the loop count $n_W=1$) and it is determined as verify PASS in the first write loop at the second time (the loop count $n_W=2$).

At Step S205 (FIG. 8), whether the loop count $n_W$ reaches a predetermined count $N_W$ or not is determined. When the loop count $n_W$ does not reach the predetermined count $N_W$, the process proceeds to Step S206. When the loop count $n_W$ reaches the predetermined count $N_W$, the process proceeds to Step S208.

At Step S206 (FIG. 8), 1 is added to the loop count $n_W$, and the process proceeds to Step S202. At Step S206, for example, the predetermined offset voltage $\Delta V_{PGM}$ is added to the program voltage $V_{PGM1}$. Accordingly, the program voltage $V_{PGM1}$ increases by the offset voltage $\Delta V_{PGM}$ together with the increase in the loop count $n_W$.

At Step S207 (FIG. 8), the status data $D_{ST}$ indicative of normal termination of the write operation is stored in the status register STR (FIG. 2) to terminate the write operation. Note that the status data $D_{ST}$ is output to the controller die CD (FIG. 1) by a status read operation.

At Step S208 (FIG. 8), the status data $D_{ST}$ indicative of failing to normally terminate the write operation is stored in the status register STR (FIG. 2) to terminate the write operation.

[Erase Operation]

Next, the erase operation of the semiconductor memory device according to the embodiment will be described.

Figure 13:
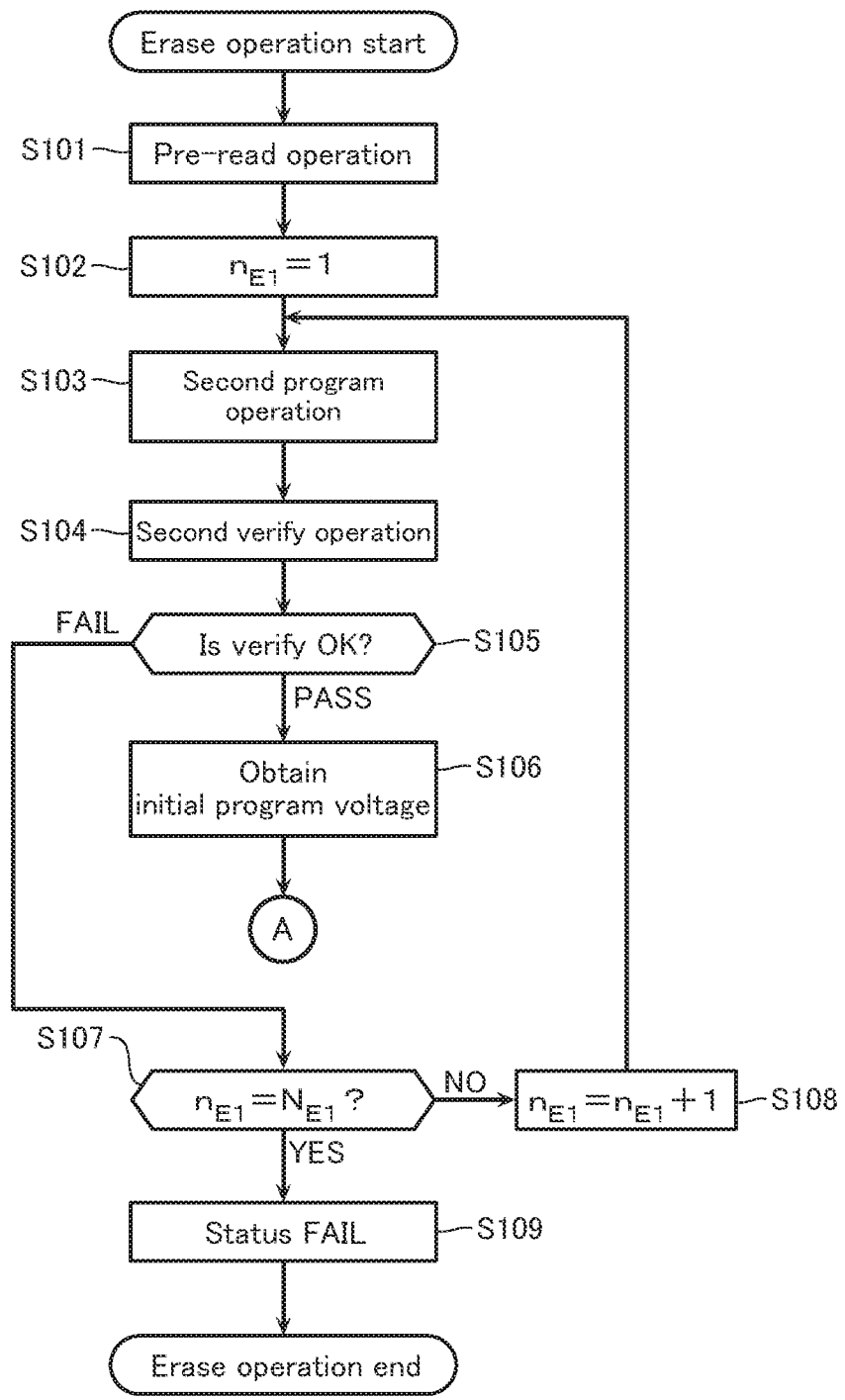
FIG. 13 is a flowchart for describing an erase operation of the first embodiment.
Figure 14:
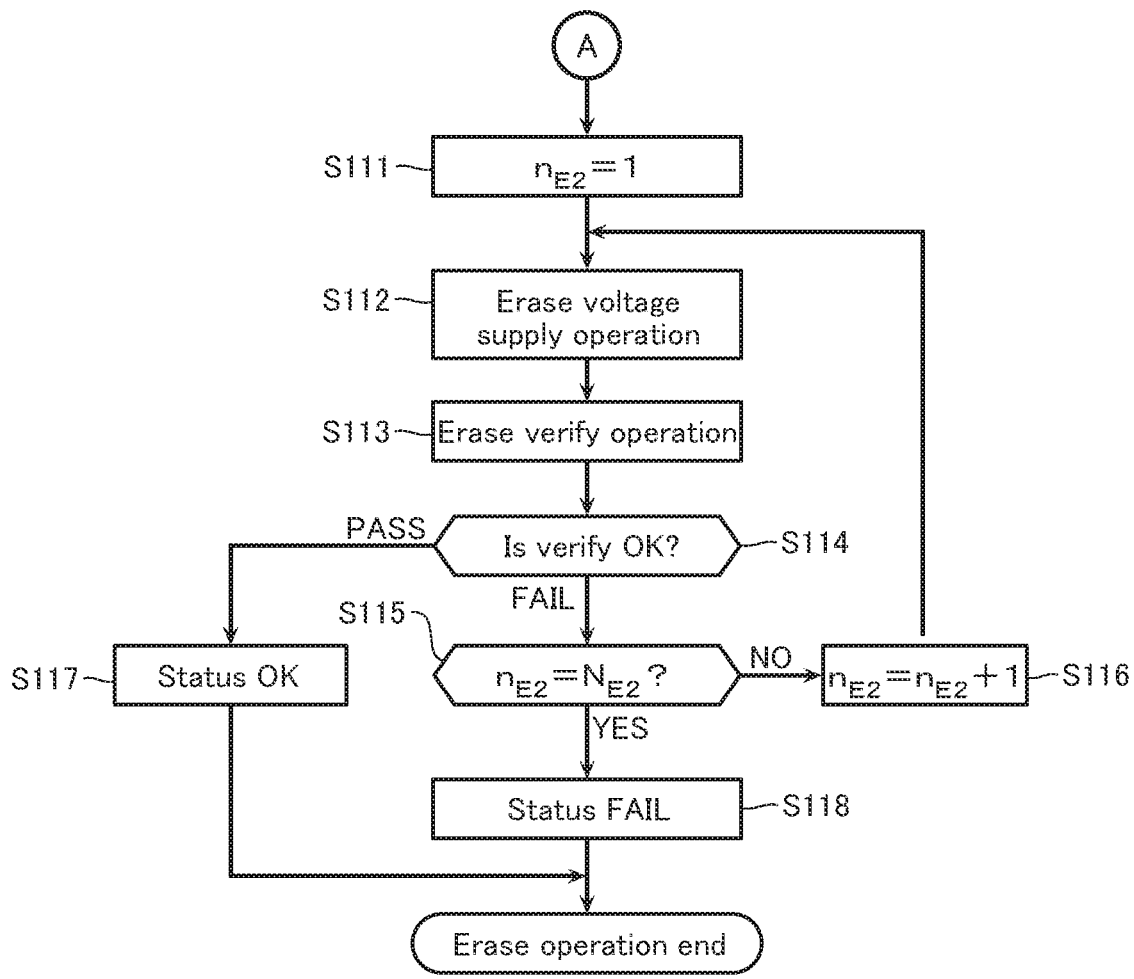
FIG. 14 is a flowchart for describing the erase operation of the first embodiment.

FIG. 13 and FIG. 14 are flowcharts for describing the erase operation of the first embodiment. The erase operation includes a program voltage control operation (Steps S101 to S109 in FIG. 13) and a usual erase operation (Steps S111 to S118 in FIG. 14).

The program voltage control operation is an operation that adjusts the initial program voltage $V_{PGMS}$ according to a degree of deterioration of the memory cell MC. The usual erase operation is an operation of erasing the data stored in the memory cell MC.

Note that, in the following description, an example of performing the erase operation on the memory block BLK target for the operation is described.

[Program Voltage Control Operation]

The program voltage control operation applies the program voltage $V_{PGM2}$ to the selected word line $WL_S$ to gradually increase the threshold voltage of the memory cell MC in the state Er up to a threshold voltage corresponding to the specific state (the state A in this embodiment). The program voltage $V_{PGM2}$ required to increase the threshold voltage up to the threshold voltage corresponding to the specific state is obtained as the initial program voltage $V_{PGMS}$ in the first program operation (S202 in FIG. 8).

The program voltage control operation includes a pre-read operation (Step S101), a second program operation (Step S103 or the like), a second verify operation (Step S104 or the like), and an obtaining operation of the initial program voltage $V_{PGMS}$ (Step S106). As illustrated in FIG. 13 and FIG. 14, the program voltage control operation is performed before performing the usual erase operation.

Additionally, the program voltage control operation includes a plurality of second write loops. Each of the second write loops includes a second program operation (Step S103 or the like) and a second verify operation (Step S104 or the like).

Figure 15:
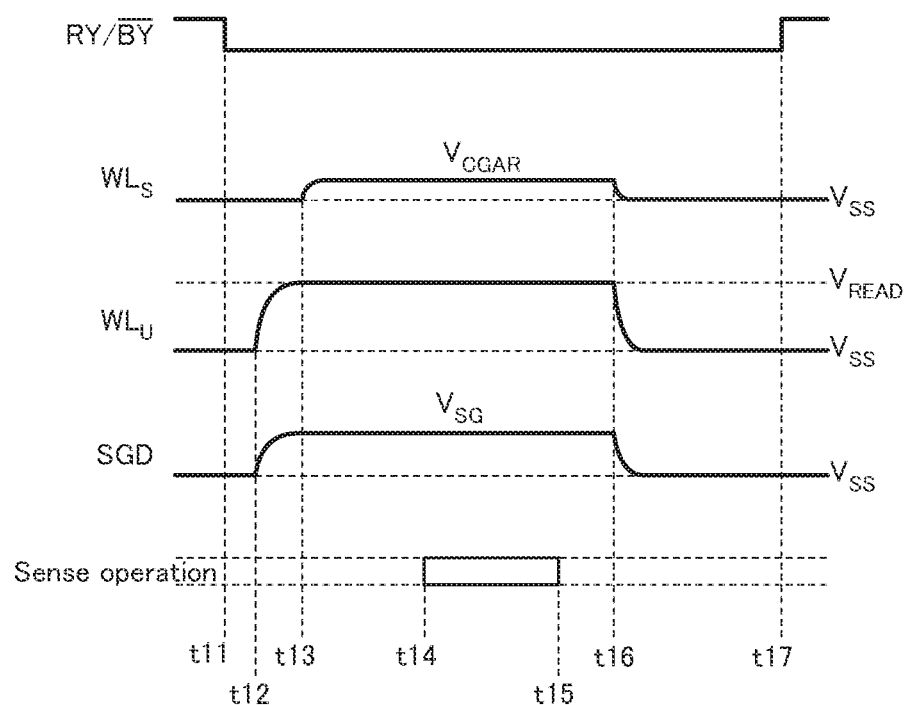
FIG. 15 is a timing chart for describing a pre-read operation.
Figure 16:
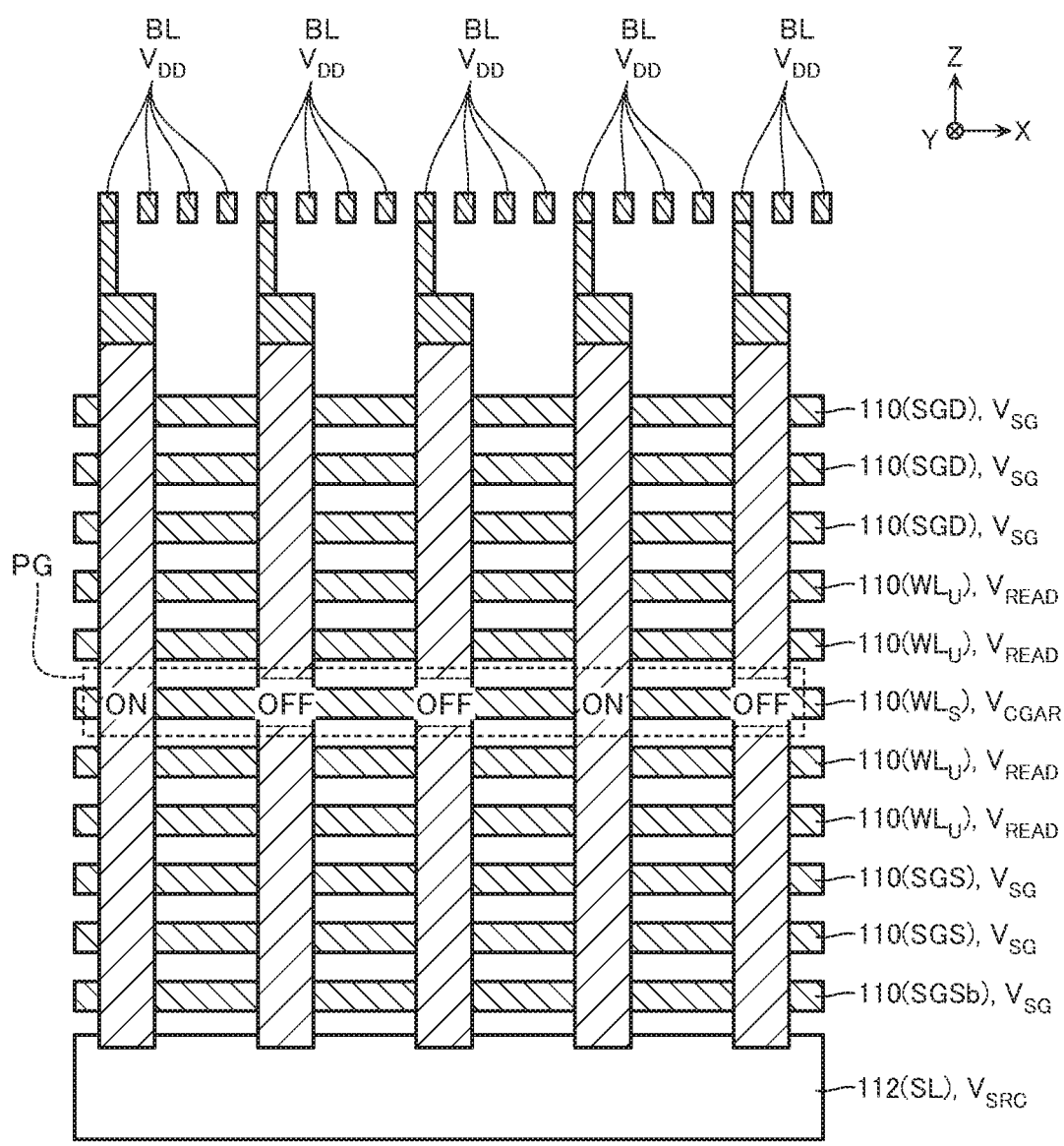
FIG. 16 is a schematic cross-sectional view for describing the pre-read operation.
Figure 17:
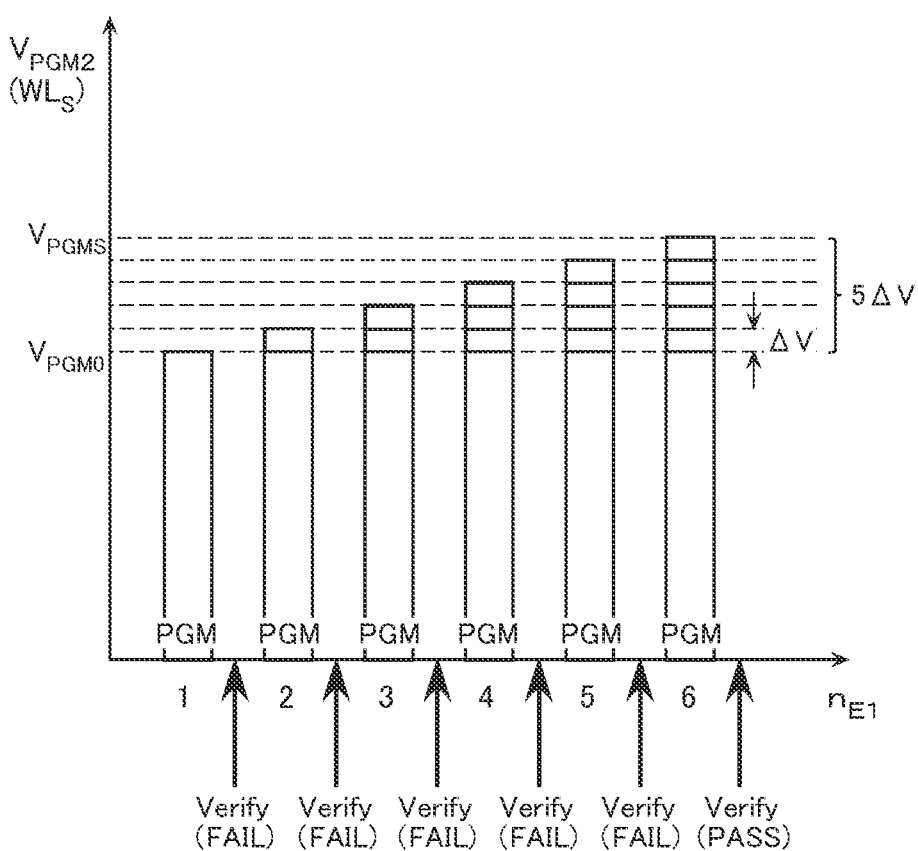
FIG. 17 is a drawing for describing a relationship between a loop count $n_{E1}$ and a program voltage $V_{PGM2}$.
Figure 18:
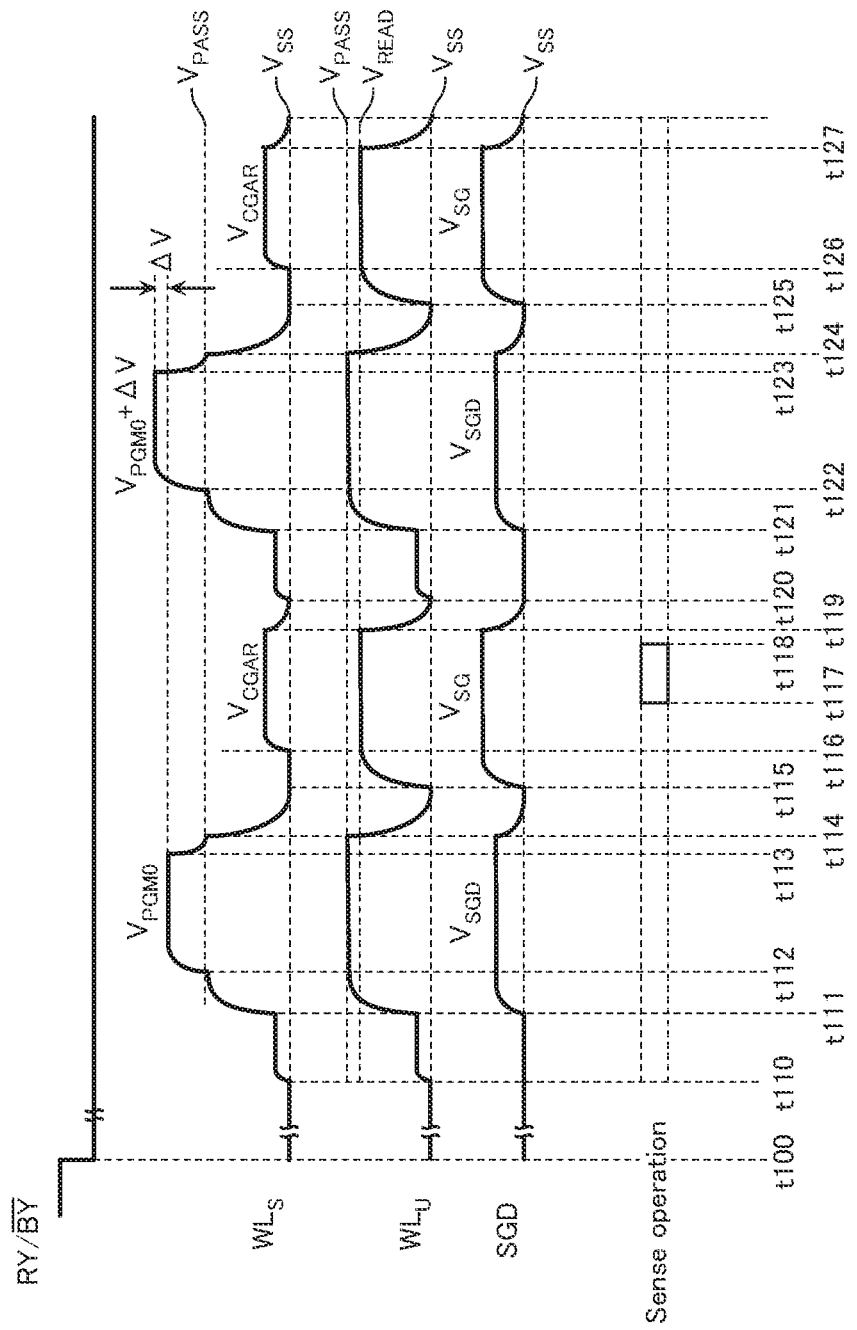
FIG. 18 is a timing chart for describing a second program operation and a second verify operation.
Figure 19:
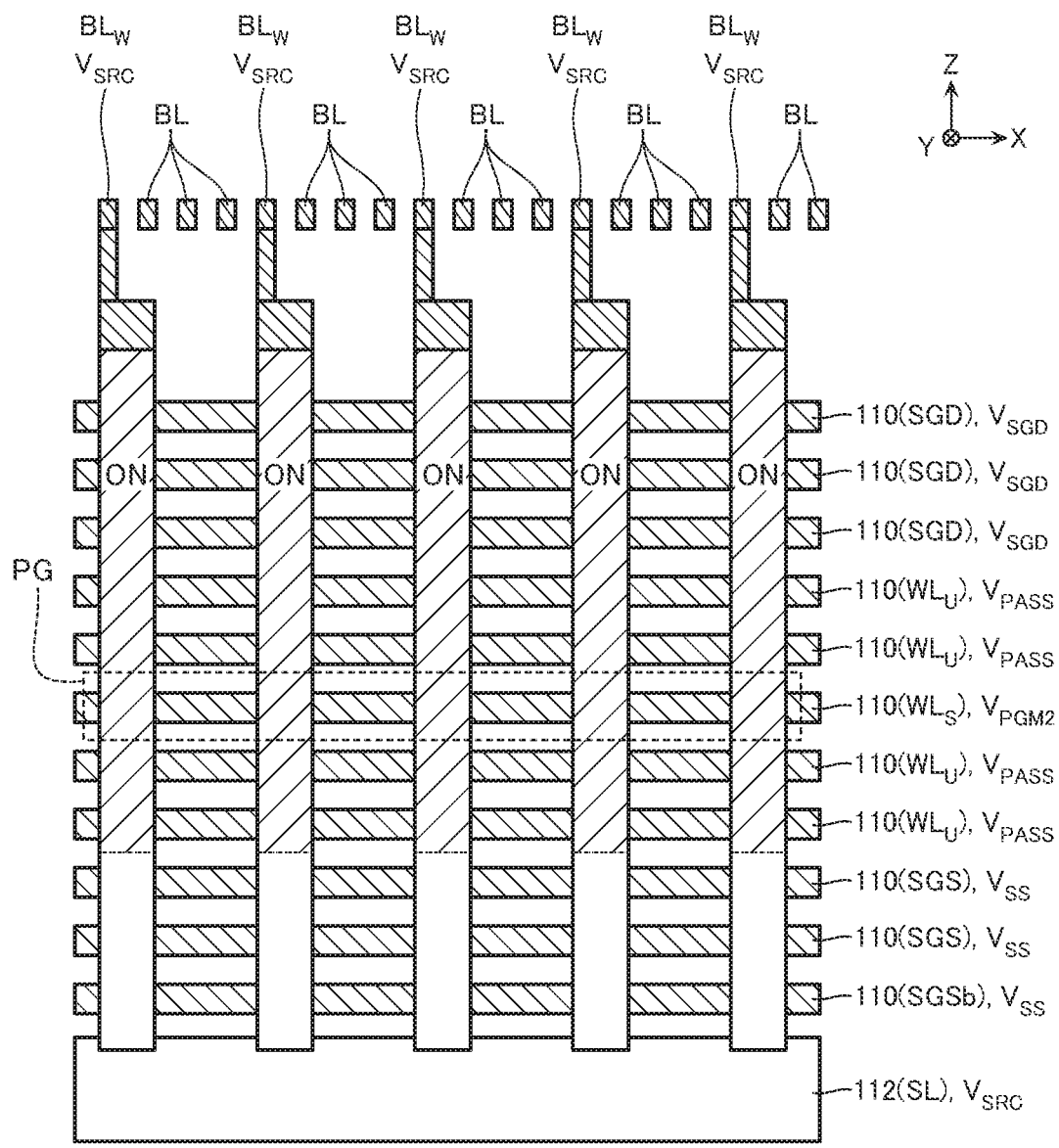
FIG. 19 is a schematic cross-sectional view for describing the second program operation.
Figure 20:
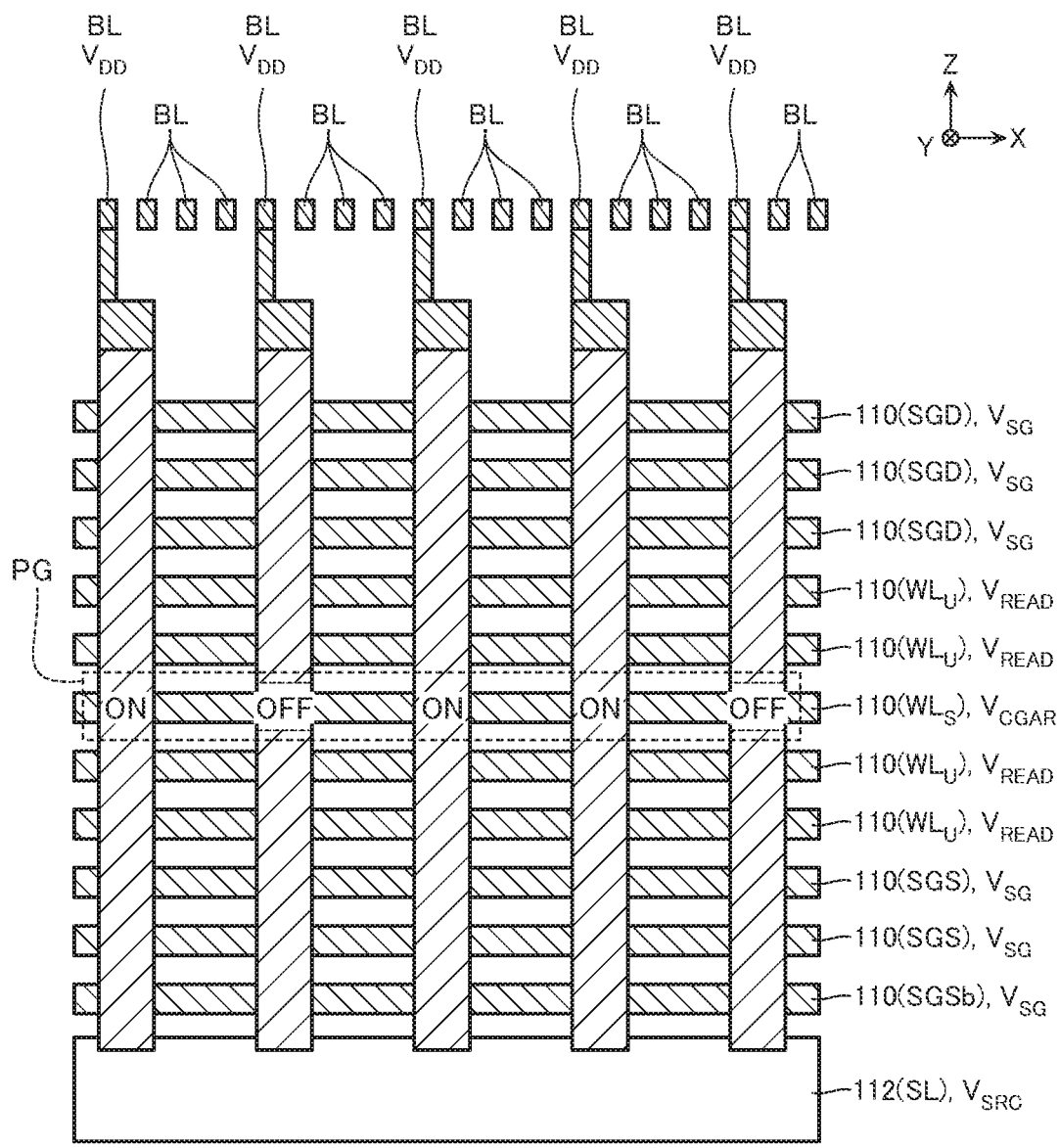
FIG. 20 is a schematic cross-sectional view for describing the second verify operation.
Figure 21:
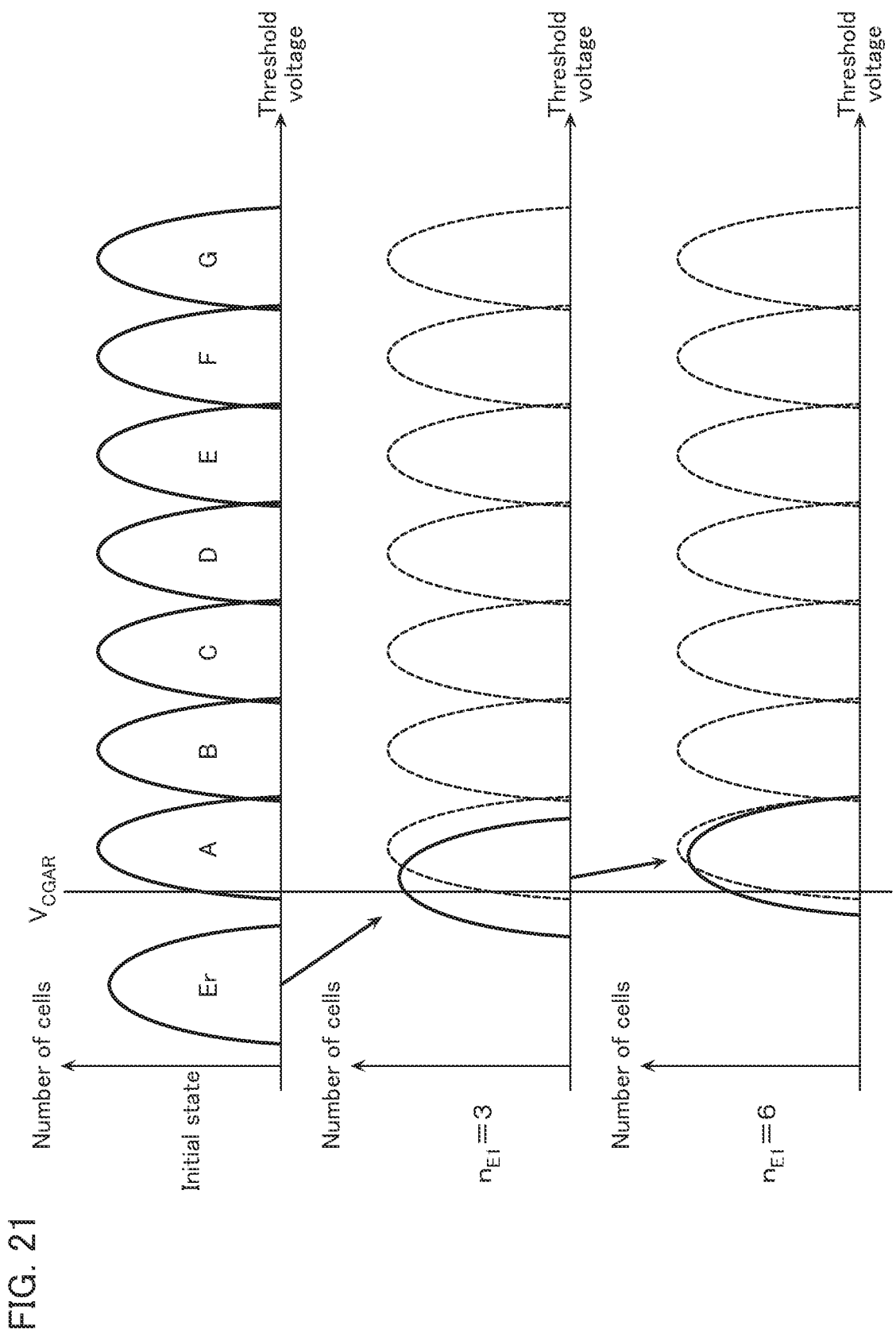
FIG. 21 is a drawing for describing the second program operation on a write word line.
Figure 22:
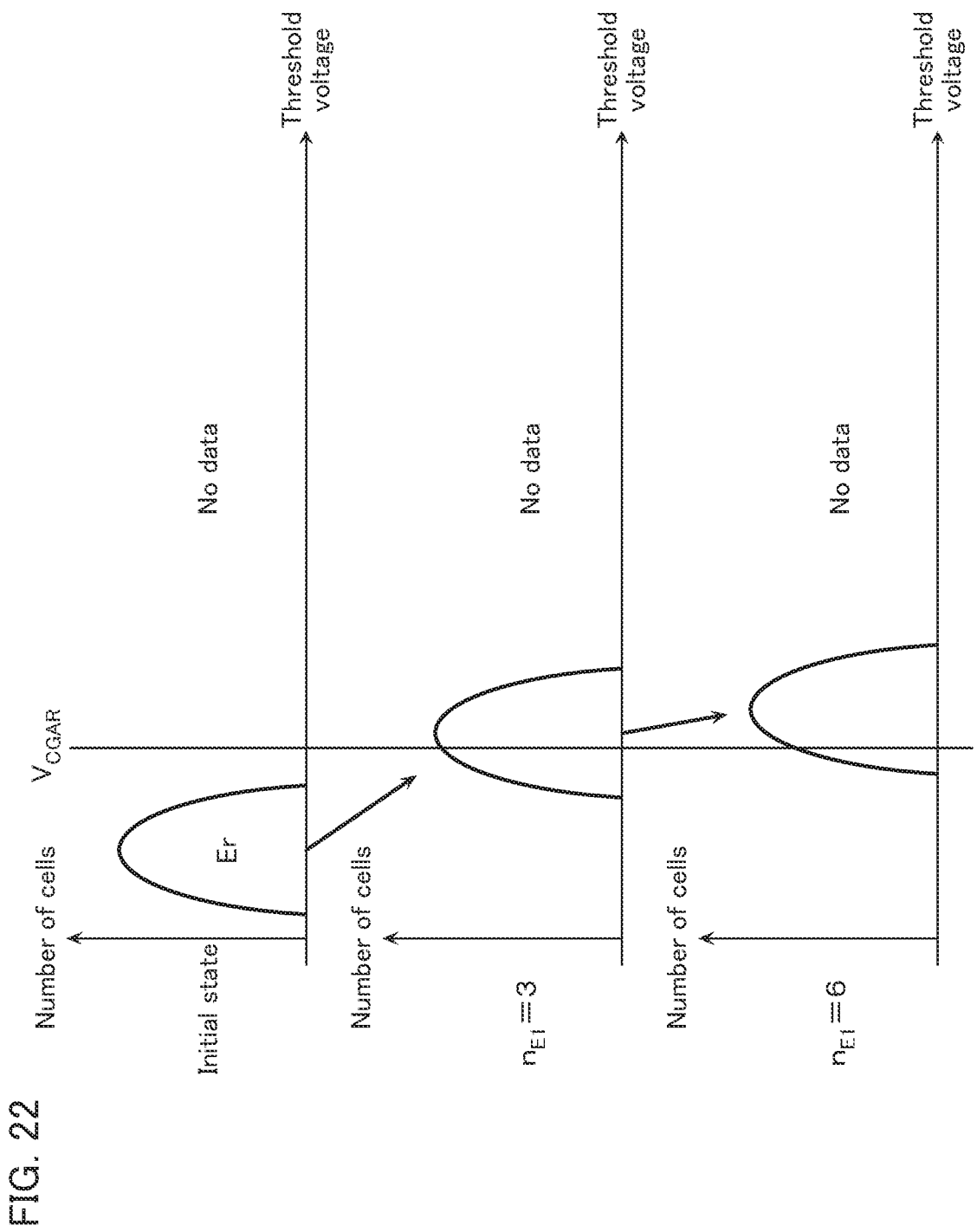
FIG. 22 is a drawing for describing the second program operation on an erase word line.

FIG. 15 is a timing chart for describing the pre-read operation. FIG. 16 is a schematic cross-sectional view for describing the pre-read operation. FIG. 17 is a drawing for describing a relationship between the loop count $n_{E1}$ and the program voltage $V_{PGM2}$. FIG. 18 is a timing chart for describing the second program operation and the second verify operation. FIG. 19 is a schematic cross-sectional view for describing the second program operation. FIG. 20 is a schematic cross-sectional view for describing the second verify operation. FIG. 21 is a drawing for describing the second program operation on the write word line. FIG. 22 is a drawing for describing the second program operation on the erase word line.

At Step S101 (FIG. 13), the pre-read operation is performed. The pre-read operation is an operation that reads the data in the plurality of selected memory cells MC corresponding to the selected page PG to identify whether the selected page PG is a page in which the data is written (that is, a page in a program state) or a page in which the data is not written (that is, a page in an erase state). Note that as the selected word line $WL_S$ connected to the selected page PG, any word line WL among the plurality of word line WL included in the memory block BLK target for the erase operation is selected. The selected word line $WL_S$ may be the predetermined word line WL. For example, the selected word line $WL_S$ may be the word line WL in a layer at a specific number counted from a source line SL side. The pre-read operation is started, for example, at timing t11 in FIG. 15.

In the pre-read operation, for example, as illustrated in FIG. 16, the voltage $V_{DD}$ is applied to the plurality of bit lines BL included in the string unit SU target for the operation. Additionally, the voltage $V_{SRC}$ is applied to the source line SL.

Additionally, in the pre-read operation, for example, as illustrated in FIG. 15 and FIG. 16, the voltage $V_{SG}$ is applied to the drain-side select gate lines SGD in a period from timing t12 until timing t16. As described above, an electron channel is formed in the channel region of the drain-side select transistor STD, and the voltage $V_{DD}$ is transferred to the channel region of the drain-side select transistor STD.

Additionally, in the pre-read operation, for example, as illustrated in FIG. 16, the voltage $V_{SG}$ is applied to the source-side select gate lines SGS, SGSb. As described above, the electron channels are formed in the channel regions of the source-side select transistors STS, STSb, and the voltage $V_{SRC}$ is transferred to the channel regions of the source-side select transistors STS, STSb.

Additionally, in the pre-read operation, for example, as illustrated in FIG. 15 and FIG. 16, the read pass voltage $V_{READ}$ is applied to the unselected word lines $WL_U$ in a period from timing t12 until timing t16. The read pass voltage $V_{READ}$ is larger than the voltages $V_{DD}$, $V_{SRC}$. Additionally, voltage differences between the read pass voltage $V_{READ}$ and the voltages $V_{DD}$, $V_{SRC}$ are larger than the threshold voltage when the memory cell MC is caused to function as an NMOS transistor regardless of the data stored in the memory cell MC. Therefore, the electron channel is formed in the channel region of the unselected memory cell MC, and the voltages $V_{DD}$, $V_{SRC}$ are transferred to the selected memory cell MC.

Additionally, in the pre-read operation, for example, as illustrated in FIG. 15 and FIG. 16, in a period from timing t13 until timing t16, a read voltage $V_{CGR}$ is applied to the selected word line $WL_S$. The read voltage $V_{CGR}$ is smaller than the read pass voltage $V_{READ}$. In this embodiment, as illustrated in FIG. 16 and FIG. 17, the read voltage $V_{CGR}$ is the read voltage $V_{CGAR}$ corresponding to the state A. A voltage difference between the read voltage $V_{CGAR}$ and the voltage $V_{SRC}$ is larger than the threshold voltage of the memory cell MC in the state Er. Accordingly, the memory cell MC in the state Er enters the ON state. Therefore, a current flows through the bit line BL connected to the memory cell MC. On the other hand, a voltage difference between the read voltage $V_{CGAR}$ and the voltage $V_{SRC}$ is smaller than the threshold voltage of the memory cell MC in the state A to the state G. Accordingly, the memory cells MC in the state A to the state G enter the OFF state. Accordingly, a current does not flow through the bit line BL connected to the memory cell MC.

Additionally, in the pre-read operation, the sense amplifier module SAM (FIG. 4) detects whether the current flows through the bit line BL or not, and thus the ON state/OFF state of the memory cell MC is detected.

In the example of FIG. 15, the sense amplifier SA performs the sense operation on the bit line BL in a period from timing t14 until timing t15.

The data indicative of the ON state/OFF state of the memory cell MC are transferred to the latch circuits XDL0 to XDL15 (FIG. 4) in the cache memory CM by the method similar to the first verify operation (Step S203 in FIG. 8).

For example, when the selected memory cell MC corresponding to one bit line BL is in the ON state, the data "1" is stored in the latch circuit XDL corresponding to the bit line BL. The data "1" indicates that the data is stored in the selected memory cell MC corresponding to one bit line BL. Hereinafter, the bit of the data "1" is referred to as a bit of ON state in some cases.

Additionally, for example, when the selected memory cell MC corresponding to one bit line BL is in the OFF state, the data "0" is stored in the latch circuit XDL corresponding to the bit line BL. The data "0" indicates that the data is not stored in the selected memory cell MC corresponding to the bit line BL. Hereinafter, the bit of the data "0" is referred to as a bit of OFF state in some cases.

Additionally, data (hereinafter referred to as read data in some cases) obtained by the pre-read operation are sequentially transferred from the latch circuits XDL0 to XDL15 to the counter CNT (FIG. 2). The counter CNT counts the number of bits of ON state (the number of bits of the data "1") among the read data. The number of bits of ON state is transferred to the sequencer SQC. The sequencer SQC determines whether the number of bits of ON state is less than a reference value Crr or not.

When the number of bits of ON state is determined to be less than the reference value Crr, the sequencer SQC determines that the selected page PG is the page in the program state. On the other hand, when the number of bits of ON state is determined to be the reference value Crr or more, the sequencer SQC determines that the selected page PG is a page in the erase state.

The sequencer SQC stores the determination result of whether the selected page PG is the page in the program state or the page in the erase state in a predetermined register.

At Step S102 (FIG. 13), the loop count $n_{E1}$ is set to 1. The loop count $n_{E1}$ is a variable indicative of the count of the second write loop. The operation is, for example, performed at timing t100 of FIG. 18.

At Step S103 (FIG. 13), the second program operation is performed. The second program operation is an operation that applies the program voltage $V_{PGM2}$ to the selected word line $WL_S$ to increase the threshold voltage of the memory cell MC. In the example of FIG. 18, the operation is performed in a period from timing t110 until timing t114 and a period from timing t120 until timing t124.

In the second program operation, for example, as illustrated in FIG. 19, the voltage $V_{SRC}$ is applied to all of the bit lines $BL_W$.

Additionally, in the second program operation, for example, as illustrated in FIG. 18 and FIG. 19, in a period from timing t111 until timing t114, the voltage $V_{SGD}$ is applied to the drain-side select gate lines SGD. In this case, as described above, the electron channel is formed in the channel region of the drain-side select transistor STD connected to the bit line $BL_W$, and the voltage $V_{SRC}$ is transferred to the channel region of the drain-side select transistor STD connected to the bit line $BL_W$.

Additionally, in the second program operation, for example, as illustrated in FIG. 19, the voltage $V_{SRC}$ is applied to the source line SL, and the ground voltage $V_{SS}$ is applied to the source-side select gate lines SGS, SGSb. Thus, the source-side select transistors STS, STSb enter the OFF state.

Additionally, in the second program operation, for example, as illustrated in FIG. 18 and FIG. 19, in a period from timing t111 until timing t114, the write pass voltage $V_{PASS}$ is applied to the unselected word lines $WL_U$. Thus, as described above, an electron channel is formed in the channel region of the unselected memory cell MC and the voltage $V_{SRC}$ is transferred to the write memory cell MC.

Additionally, in the second program operation, for example, as illustrated in FIG. 18 and FIG. 19, in a period from timing t112 until timing t113, the program voltage $V_{PGM2}$ is applied to the selected word line $WL_S$. The program voltage $V_{PGM2}$ is larger than the write pass voltage $V_{PASS}$.

FIG. 17 illustrates an example of performing the second program operation six times in the second write loop. In the second program operation (the period from timing t112 until timing t113 in FIG. 18) in the second write loop at the first time (loop count $n_{E1}$=1), an initial program voltage $V_{PGM0}$ is applied to the selected word line $WL_S$. The initial program voltage $V_{PGM0}$ is an initial value of the program voltage $V_{PGM2}$. Additionally, in the second program operation (in a period from timing t122 until timing t123 in FIG. 18) in the second write loop at the second time (loop count $n_{E1}$=2), a voltage ($V_{PGM0}$+$\Delta V$) found by adding the offset voltage $\Delta V$ to the initial program voltage $V_{PGM0}$ is applied to the selected word line $WL_S$ as the program voltage $V_{PGM2}$. In the second program operation in the second write loop at the third time to the sixth time (loop count $n_{E1}$=3 to 6), each of a voltage ($V_{PGM0}$+2$\Delta V$), a voltage ($V_{PGM0}$+3$\Delta V$), a voltage ($V_{PGM0}$+4$\Delta V$), and a voltage ($V_{PGM0}$+5$\Delta V$) is applied to the selected word line $WL_S$ as the program voltage $V_{PGM2}$.

In the second program operation as described above, by applying the operating voltages as illustrated in FIG. 18 and FIG. 19 to the bit line BL, the source line SL, the word line WL, and the select gate lines (SGD, SGS), the threshold voltage of the selected memory cell MC increases in phases.

For example, when the selected page PG is the page in the program state, as illustrated in FIG. 21, in the initial state, the threshold voltages of the plurality of memory cells MC corresponding to the selected page PG distribute to the state Er to the state G. As illustrated in FIG. 17, the program voltage $V_{PGM2}$ in the second program operation increases by the offset voltage $\Delta V$ together with the increase in the number of times of execution (the loop count $n_{E1}$) of the second write loop. Therefore, the threshold voltage of the memory cell MC corresponding to the state Er also increases in phases together with the increase in the number of times of execution (the loop count $n_{E1}$) of the second write loop. For example, as illustrated in FIG. 21, the threshold voltage of the memory cell MC corresponding to the state Er when the loop count $n_{E1}$ is 3 is larger than that when in the initial state. Additionally, the threshold voltage of the memory cell MC corresponding to the state Er when the loop count $n_{E1}$ is 5 is larger than that when the loop count $n_{E1}$ is 3. Thus, a threshold distribution corresponding to the state Er gradually approaches the threshold distribution corresponding to the state A.

The memory cells MC corresponding to the state A to the state G have an increase width of the threshold voltage smaller than that of the memory cell MC corresponding to the state Er.

Additionally, for example, when the selected page PG is the page in the erase state, as illustrated in FIG. 22, in the initial state, threshold voltages of the plurality of memory cells MC corresponding to the selected page PG are included in the threshold distribution corresponding to the state Er. The threshold voltage of the memory cell MC corresponding to the state Er increases in phases together with the increase in the number of times of execution (the loop count $n_{E1}$) of the second write loop.

At Step S104 (FIG. 13), the second verify operation is performed. The second verify operation is an operation that applies the verify voltage (for example, a voltage having the value same as the read voltage $V_{CGAR}$) to the selected word line $WL_S$ and detects the ON state/OFF state of the memory cell MC to detect whether the threshold voltage of the memory cell MC reaches the target value or not. In the example of FIG. 18, this operation is performed in a period from timing t115 until timing t119 and a period from timing t125 until timing t127.

In the second verify operation, for example, as illustrated in FIG. 20, the voltage $V_{DD}$ is applied to all of the bit lines BL corresponding to the selected page PG. Additionally, the voltage $V_{SRC}$ is applied to the source line SL.

Additionally, in the second verify operation, for example, as illustrated in FIG. 18 and FIG. 20, in a period from timing t115 until timing t119, the voltage $V_{SG}$ is applied to the drain-side select gate lines SGD. In this case, as described above, an electron channel is formed in the channel region of the drain-side select transistor STD, and the voltage $V_{DD}$ is transferred the channel region of the drain-side select transistor STD.

In the second verify operation, for example, as illustrated in FIG. 20, the voltage $V_{SG}$ is applied to the source-side select gate lines SGS, SGSb. In this case, as described above, the electron channels are formed in the channel regions of the source-side select transistors STS, STSb, and the voltage $V_{SRC}$ is transferred to the channel regions of the source-side select transistors STS, STSb.

In the second verify operation, for example, as illustrated in FIG. 18 and FIG. 20, in a period from timing t115 until timing t119, the read pass voltage $V_{READ}$ is applied to the unselected word lines $WL_U$. In this case, as described above, the electron channel is formed in the channel region of the unselected memory cell MC, and the voltages $V_{DD}$, $V_{SRC}$ are transferred to the selected memory cell MC.

Additionally, in the second verify operation, for example, as illustrated in FIG. 18 and FIG. 20, in a period from timing t116 until timing t119, the verify voltage is applied to the selected word line $WL_S$. In the example of FIG. 18 and FIG. 20, the verify voltage is set to be the voltage having the value same as the read voltage $V_{CGAR}$ corresponding to the state A. Thus, as illustrated in FIG. 20, the memory cells MC having the threshold voltages equal to or less than the verify voltage (the read voltage $V_{CGAR}$) enter the ON state, and the memory cells MC having the threshold voltages larger than the verify voltage (the read voltage $V_{CGAR}$) enter the OFF state. The sense amplifier module SAM (FIG. 4) detects the ON states/OFF states of these memory cells MC via the bit lines BL and obtains the data indicative of the states of the memory cells MC.

In the example of FIG. 18, the sense amplifier SA performs the sense operation on the bit lines BL in the period from timing t117 until timing t118.

The data indicative of the ON state/OFF state of the memory cell MC are transferred to the latch circuits XDL0 to XDL15 (FIG. 4) in the cache memory CM by the method similar to the first verify operation (Step S203 in FIG. 8).

When the selected memory cell MC is in the ON state, the data "1" is stored in the latch circuit XDL. Additionally, when the selected memory cell MC is in the OFF state, the data "0" is stored in the latch circuit XDL. As described above, the bit of the data "1" is referred to as the bit of verify FAIL and the bit of the data "0" is referred to as the bit of verify PASS in some cases.

At Step S105 (FIG. 13), the result of the second verify operation is determined. For example, data (hereinafter referred to as second verify data in some cases) obtained by the second verify operation at Step S104 is sequentially transferred from the latch circuits XDL0 to XDL15 to the counter CNT (FIG. 2). The counter CNT counts the number of bits of verify FAIL (the number of bits of the data "1") among the second verify data. The number of bits of verify FAIL is counted, for example, at the end of Step S104. The number of bits of verify FAIL is transferred to the sequencer SQC.

The sequencer SQC confirms whether the selected page PG is determined to be the page in the program state or is determined to be the page in the erase state in the pre-read operation (Step S101). Next, when the selected page PG is determined to be the page in the program state, the sequencer SQC determines whether the number of bits of verify FAIL in the second verify data is less than a second reference value Cr21 for the page in the program state or not. When the selected page PG is determined to be the page in the erase state, the sequencer SQC determines whether the number of bits of verify FAIL in the second verify data is less than a second reference value Cr22 for the page in the erase state or not.

As described above, in the initial state, the number of selected memory cells MC in the threshold distribution corresponding to the state Er in the selected page PG in the erase state is larger than that of the selected page PG in the program state. That is, the number of selected memory cells MC as the determination target at Step S105 is large. Therefore, the second reference value Cr22 for the page in the erase state is set to be a value larger than the second reference value Cr21 for the page in the program state.

When the number of bits of verify FAIL in the second verify data is less than the second reference value (Cr21 or Cr22), the sequencer SQC determines it as verify PASS, and the process proceeds to Step S106. On the other hand, when the number of bits of verify FAIL in the second verify data is the second reference value (Cr21 or Cr22) or more, the sequencer SQC determines it as verify FAIL, and the process proceeds to Step S107.

Note that in the example of FIG. 17, it is determined as verify FAIL in the second write loop at the first time to the fifth time (loop count $n_{E1}$=1 to 5) and it is determined as verify PASS in the second write loop at the sixth time (loop count $n_{E1}$=6).

At Step S107 (FIG. 13), whether the loop count $n_{E1}$ reaches a predetermined count $N_{E1}$ or not is determined. When the loop count $n_E$ does not reach the predetermined count $N_{E1}$, the process proceeds to Step S108. When the loop count $n_E$ reaches predetermined count $N_{E1}$, the process proceeds to Step S109.

At Step S108 (FIG. 13), 1 is added to the loop count $n_{E1}$, and the process proceeds to Step S103. At Step S108, for example, the predetermined offset voltage ΔV is added to the program voltage $V_{PGM2}$. Accordingly, the program voltage $V_{PGM2}$ increases by the offset voltage ΔV together with the increase in the loop count $n_{E1}$.

At Step S109 (FIG. 13), the status data $D_{ST}$ indicative of failing to normally terminate the erase operation is stored in the status register STR (FIG. 2) to terminate the erase operation.

At Step S106 (FIG. 13), the value of the program voltage $V_{PGM2}$ at the time point of verify PASS is obtained as the initial program voltage $V_{PGMS}$ in the first program operation (Step S202 in FIG. 8) in the write operation. Then, the process proceeds to Step S111 in FIG. 14.

Note that while the erase operation is performed by the memory block BLK, the write operation is performed by the page PG. The initial program voltage $V_{PGMS}$ obtained at Step S106 is the initial value of the program voltage $V_{PGM1}$ in all of the pages PG included in the memory block BLK target for the erase operation.

Additionally, the data indicative of the initial program voltage $V_{PGMS}$ obtained at Step S106 in FIG. 13 is transferred to the controller die CD via the input/output control circuit I/O. The controller die CD stores the data indicative of the initial program voltage $V_{PGMS}$ in a predetermined storage unit and manages the initial program voltage $V_{PGMS}$ in the write operation by the memory block BLK. Accordingly, even when the period from when the erase operation is performed until the write operation is performed lengthens, the initial program voltage $V_{PGMS}$ can be appropriately managed. In this case, at Step S200 in FIG. 8, the data indicative of the initial program voltage $V_{PGMS}$ transferred from the controller die CD is set.

Note that, in the first embodiment, the initial program voltage $V_{PGMS}$ obtained at Step S106 in FIG. 13 and the initial program voltage $V_{PGMS}$ used at Step S202 in FIG. 8 are the voltages having the same value. However, the initial program voltage $V_{PGMS}$ obtained at Step S106 in FIG. 13 and the initial program voltage $V_{PGMS}$ used at Step S202 in FIG. 8 may be the voltages having different values. For example, as long as the initial program voltage used at Step S202 in FIG. 8 is a voltage according to the initial program voltage $V_{PGMS}$ obtained at Step S106 in FIG. 13, it may be a voltage larger than or smaller than the initial program voltage $V_{PGMS}$.

The memory cells MC included in one memory block BLK vary in characteristics (likelihood of being written) according to the position in the Z-direction. For example, as illustrated in FIG. 5 and FIG. 6, the semiconductor column 120, the gate insulating film 130, and the like are formed inside a memory hole having an approximately cylindrical shape and extending in the Z-direction. Here, generally, a diameter of the memory hole on a side (−Z-direction side) close to the source line SL (the conductive layer 112) is smaller than that of a side (+Z-direction side) close to the bit line BL. The smaller the diameter of the memory hole is, the stronger the electric field becomes. Therefore, as the diameter of the memory hole becomes small, the electrons are likely to be injected into the electric charge accumulating film 132 (likely to be written).

The initial program voltage $V_{PGMS}$ (FIG. 9 and FIG. 10) may be corrected considering the variation in characteristics (likelihood of being written). For example, the memory cell MC selected at Step S103 and Step S104 in FIG. 13 is referred to as the reference memory cell MC. For example, when the write operation is performed on the memory cell MC disposed at the position where the diameter of the memory hole is smaller than that of the reference memory cell MC, the initial program voltage $V_{PGMS}$ may be smaller than the initial program voltage $V_{PGMS}$ obtained at Step S106. Similarly, when the write operation is performed on the memory cell MC disposed at the position where the diameter of the memory hole is larger than that of the reference memory cell MC, the initial program voltage $V_{PGMS}$ may be larger than the initial program voltage $V_{PGMS}$ obtained at Step S106.

[Usual Erase Operation]

Figure 23:
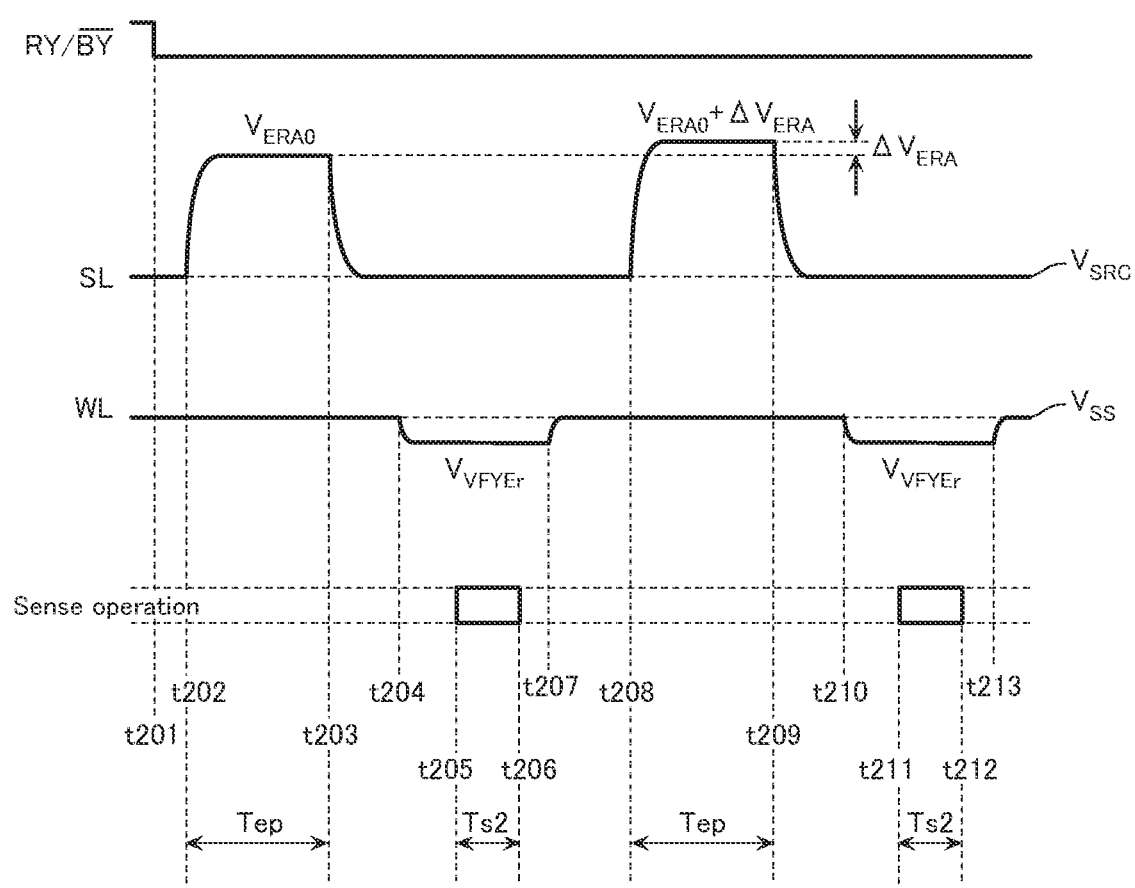
FIG. 23 is a timing chart for describing an erase voltage supply operation and an erase verify operation.
Figure 24:
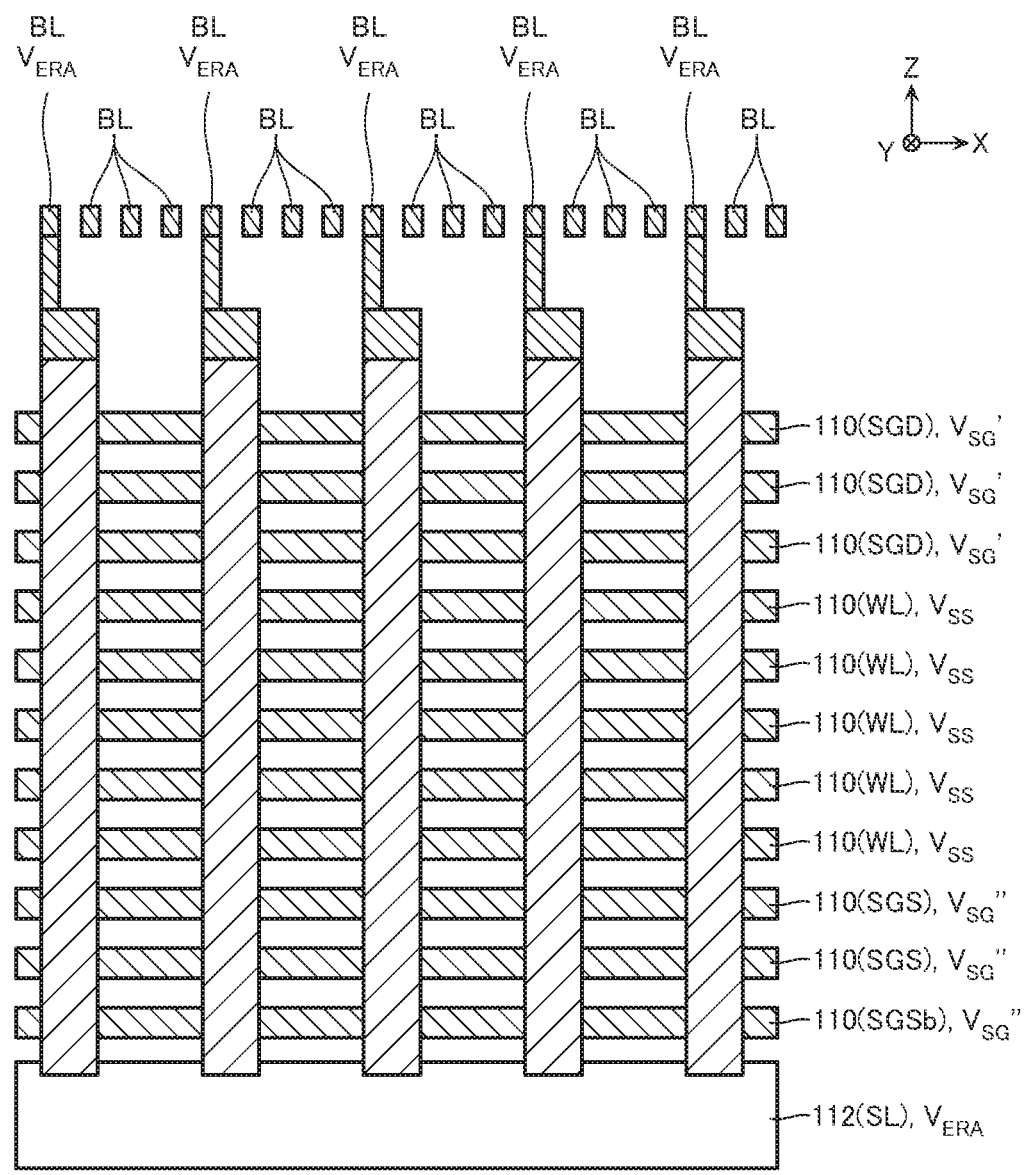
FIG. 24 is a schematic cross-sectional view for describing the erase voltage supply operation.
Figure 25:
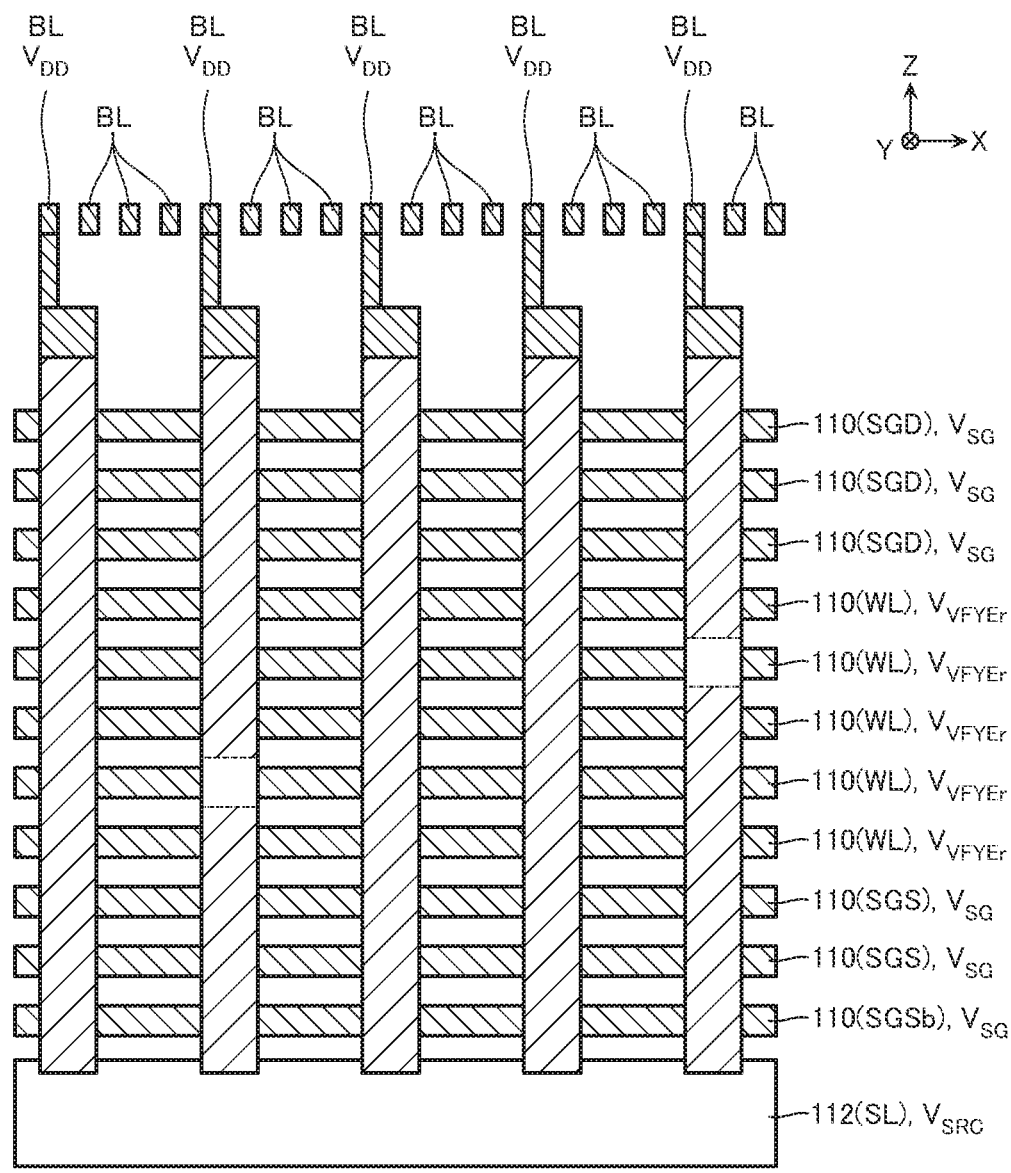
FIG. 25 is a schematic cross-sectional view for describing the erase verify operation.

FIG. 23 is a timing chart for describing the usual erase operation. FIG. 24 is a schematic cross-sectional view for describing the erase voltage supply operation included in the usual erase operation. FIG. 25 is a schematic cross-sectional view for describing the erase verify operation included in the usual erase operation.

The usual erase operation includes a plurality of erase loops. Each of the erase loops include an operation of reducing the threshold voltage of the memory cell MC (for example, Step S112 in FIG. 14 described later) and an operation of confirming the threshold voltage of the memory cell MC (for example, Step S113 in FIG. 14 described later). The same applies to the erase loops in the usual erase operation of a second embodiment.

At Step S111 (FIG. 14), a loop count $n_{E2}$ is set to 1. The loop count $n_{E2}$ is a variable indicative of the count of the erase loop. This operation is performed, for example, at timing t201 in FIG. 23.

At Step S112 (FIG. 14), the erase voltage supply operation is performed. The erase voltage supply operation is an operation that applies the ground voltage $V_{SS}$ to the word line WL and applies an erase voltage $V_{ERA}$ to the source line SL and the bit line BL to reduce the threshold voltage of the memory cell MC. In the example of FIG. 23, this operation is performed in a period from timing t202 until timing t203 and a period from timing t208 until timing t209.

In the erase voltage supply operation, for example, as illustrated in FIG. 23 and FIG. 24, the erase voltage $V_{ERA}$ (an initial erase voltage $V_{ERA0}$ in FIG. 23) is applied to the bit line BL and the source line SL. The erase voltage $V_{ERA}$ is, for example, a voltage around 17 V to 25 V.

In the erase voltage supply operation, for example, as illustrated in FIG. 24, a voltage $V_{SG}'$ is applied to the drain-side select gate line SGD. The voltage $V_{SG}'$ is smaller than the erase voltage $V_{ERA}$. Thus, a Gate Induced Drain Leakage (GIDL) occurs in the drain-side select transistor STD, and electron and hole pair occurs. Additionally, the electrons move to a bit line BL side, and the holes move to a memory cell MC side.

Additionally, in the erase voltage supply operation, for example, as illustrated in FIG. 24, a voltage $V_{SG}''$ is applied to the source-side select gate lines SGS, SGSb. The voltage $V_{SG}''$ is smaller than the erase voltage $V_{ERA}$. Thus, a GIDL occurs in the source-side select transistors STS, STSb, and electron and hole pair occurs. Additionally, the electrons move to the source line SL side, and the holes move to the memory cell MC side.

Additionally, in the erase voltage supply operation, for example, as illustrated in FIG. 23 and FIG. 24, the ground voltage $V_{SS}$ is applied to the word line WL. Thus, the holes in the channel of the semiconductor column 120 tunnel in the electric charge accumulating film 132 (FIG. 6) via the tunnel insulating film 131 (FIG. 6). Thus, the threshold voltage of the memory cell MC decreases.

At Step S113 (FIG. 14), the erase verify operation is performed. The erase verify operation is an operation for applying the erase verify voltage $V_{VFYEr}$ (FIG. 7A to FIG. 7C) to the selected word line $WL_S$, detecting the ON state/OFF state of the memory cell MC, and detecting whether the threshold voltage of the memory cell MC reaches the target value or not. In the example of FIG. 23, the operation is performed in a period from timing t204 until timing t207 and a period from timing t210 until timing t213.

For example, as illustrated in FIG. 25, in the erase verify operation, the voltage $V_{DD}$ is applied to the bit line BL. Additionally, the voltage $V_{SRC}$ is applied to the source line SL.

Additionally, in the erase verify operation, for example, as illustrated in FIG. 25, the voltage $V_{SG}$ is applied to the drain-side select gate lines SGD. As described above, an electron channel is formed in the channel region of the drain-side select transistor STD, and the voltage $V_{DD}$ is transferred to the channel region of the drain-side select transistor STD.

Additionally, in the erase verify operation, for example, as illustrated in FIG. 25, the voltage $V_{SG}$ is applied to the source-side select gate lines SGS, SGSb. As described above, electron channels are formed in the channel regions of the source-side select transistors STS, STSb, and the voltage $V_{SRC}$ is transferred to the channel regions of the source-side select transistors STS, STSb.

Additionally, in the erase verify operation, for example, as illustrated in FIG. 25, the erase verify voltage $V_{VFYEr}$ is applied to the word lines WL. The erase verify voltage $V_{VFYEr}$ is smaller than the read pass voltage $V_{READ}$ (FIG. 7A to FIG. 7C). Thus, as illustrated in FIG. 25, the memory cells MC having the threshold voltages equal to or less than the erase verify voltage $V_{VFYEr}$ become the ON state, and the memory cells MC having the threshold voltages larger than the erase verify voltage $V_{VFYEr}$ become the OFF state. The sense amplifier module SAM (FIG. 4) detects the ON states/OFF states of these memory cells MC via the bit lines BL and obtains the data indicative of the states of the memory cells MC.

In the example of FIG. 23, the sense amplifier SA performs the sense operation on the bit line BL in a period from timing t205 until timing t206. The period from timing t205 until timing t206 is referred to as a sense time Ts2 in some cases.

The data indicative of the ON state/OFF state of the memory cell MC is transferred to the latch circuits XDL0 to XDL15 (FIG. 4) in the cache memory CM by the method similar to the first verify operation (Step S203 in FIG. 8).

When the memory cell MC is in the ON state, the data "1" is stored in the latch circuit XDL. Additionally, when the memory cell MC is in the OFF state, the data "0" is stored in the latch circuit XDL. As described above, the bit of the data "1" is referred to as a bit of erase verify PASS and the bit of the data "0" is referred to as a bit of erase verify FAIL in some cases.

At Step S114 (FIG. 14), the result of the erase verify operation is determined. For example, data (hereinafter referred to as erase verify data in some cases) obtained by the erase verify operation at Step S113 is sequentially transferred from the latch circuits XDL0 to XDL15 to the counter CNT (FIG. 2). The counter CNT counts the number of bits of erase verify FAIL (the number of bits of the data "0") among the erase verify data. The number of bits of erase verify FAIL is counted at the end of Step S113. The number of bits of erase verify FAIL is transferred to the sequencer SQC.

The sequencer SQC determines whether the number of bits of erase verify FAIL in the erase verify data is less than a reference value Cre or not. When the number of bits of erase verify FAIL is determined to be the reference value Cre or more, it is determined as erase verify FAIL, and the process proceeds to Step S115. On the other hand, when the number of bits of erase verify FAIL is determined to be less than the reference value Cre, it is determined as erase verify PASS, and the process proceeds to Step S117.

At Step S115 (FIG. 14), whether the loop count $n_{E2}$ reaches a predetermined count $N_{E2}$ or not is determined. When the loop count $n_{E2}$ does not reach the predetermined count $N_{E2}$, the process proceeds to Step S116. When the loop count $n_{E2}$ reaches the predetermined count $N_{E2}$, the process proceeds to Step S118.

At Step S116 (FIG. 14), 1 is added to the loop count $n_{E2}$, and the process proceeds to Step S112. At Step S116, for example, a predetermined offset voltage $\Delta V_{ERA}$ is added to the erase voltage $V_{ERA}$. Accordingly, the erase voltage $V_{ERA}$ increases by the offset voltage $\Delta V_{ERA}$ together with the increase in the loop count $n_{E2}$.

At Step S117 (FIG. 14), the status data $D_{ST}$ indicative of normal termination of the erase operation is stored in the status register STR (FIG. 2) to terminate the erase operation. Note that the status data $D_{ST}$ is output to the controller die CD (FIG. 1) by the status read operation.

At Step S118 (FIG. 14), the status data $D_{ST}$ indicative of failing to normally terminate the erase operation is stored in the status register STR (FIG. 2) to terminate the erase operation.

[Effects]

The memory cell MC deteriorates as the numbers of executions of the write operation and the erase operation increase, and the electrons are likely to tunnel in the electric charge accumulating film 132. In the state, the threshold voltage is likely to increase in the first program operation. Accordingly, when the initial value of the program voltage is not adjusted regardless of the degree of deterioration of the memory cell MC, the threshold voltage of the memory cell MC excessively increases in the first program operation in some cases. Therefore, in this embodiment, a program voltage control operation that adjusts the initial value of the program voltage according to the degree of deterioration of the memory cell MC is performed.

Additionally, it is considered that the program voltage control operation is performed in, for example, the write operation. However, in this case, since the time is taken for performing the program voltage control operation, the time for the write operation increases. Further, the operating time of the write operation is required to shorten at high speed than that of the erase operation. Therefore, in the first embodiment, performing the program voltage control operation in the erase operation obtains the optimal initial program voltage according to the degree of deterioration of the memory cell MC and reduces an increase in the time for the write operation.

Second Embodiment

In the first embodiment, the initial program voltage $V_{PGMS}$ according to the degree of deterioration of the memory cell MC is obtained in the program voltage control operation in the erase operation, and the first program operation in the write operation is performed using the obtained initial program voltage $V_{PGMS}$. In the second embodiment, in addition to the configuration of the first embodiment, a parameter (an erase parameter) used in the usual erase operation is changed according to the degree of deterioration of the memory cell MC.

Figure 26:
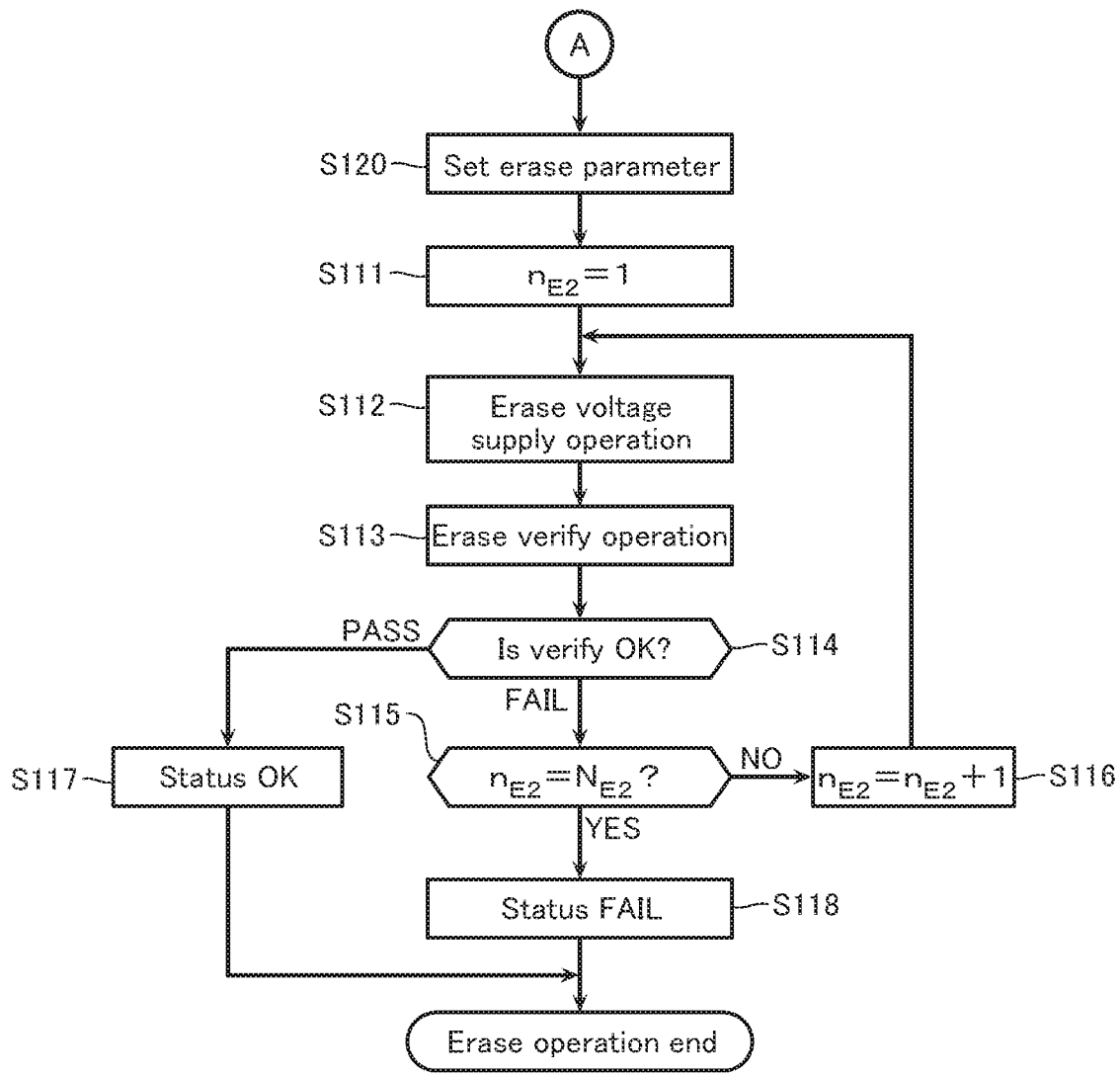
FIG. 26 is a flowchart for describing an erase operation of a second embodiment.

FIG. 26 is a flowchart for describing the erase operation of the second embodiment.

At Step S120, the erase parameter used for the usual erase operation is set. The erase parameter is, for example, (1) the magnitude (the voltage value) of the erase voltage $V_{ERA}$, (2) the supply time of the erase voltage $V_{ERA}$ (Tep in FIG. 23), and (3) the sense time of the sense amplifier SA (Ts2 in FIG. 23).

Note that, in the usual erase operation of the second embodiment, Steps S111 to S118 in FIG. 14 are performed similarly to the usual erase operation in the first embodiment. Therefore, detailed descriptions of the processes will be omitted.

When the memory cell MC deteriorates, the data stored in the memory cell MC is less likely to be erased in some cases. Additionally, when the memory cell MC deteriorates, a current is less likely to flow in the bit line BL or the like, and accuracy of the sense operation in the erase verify operation decreases in some cases. Therefore, in the second embodiment, the erase parameters (1) to (3) are adjusted according to the degree of deterioration of the memory cell MC obtained in the program voltage control operation.

For example, the erase parameters (1) to (3) are changed according to the initial program voltage $V_{PGMS}$ obtained at Step S106 or the loop count $n_{E1}$ at the time point where the initial program voltage $V_{PGMS}$ is obtained. For example, as the deterioration of the memory cell MC proceeds, the voltage value of the erase voltage $V_{ERA}$ is increased. Additionally, as the deterioration of the memory cell MC proceeds, the supply time Tep of the erase voltage $V_{ERA}$ is lengthened. As the deterioration of the memory cell MC proceeds, a sense time Ts2 is lengthened. However, due to the configuration of the semiconductor memory device or the like, the relationship between the degree of deterioration of the memory cell MC and the erase parameters (1) to (3) possibly changes. Therefore, the increase and decrease in the erase parameters (1) to (3) according to the degree of deterioration of the memory cell MC may be opposite to the above-described example.

According to the configuration, using the erase parameter according to the degree of deterioration of the memory cell MC, the erase voltage supply operation and the erase verify operation can be performed. As a result, the data in the memory cell MC can be appropriately erased in the usual erase operation.

Note that at Step S120, all of the erase parameters (1) to (3) may be set or any one or two of the erase parameters (1) to (3) may be set.

Third Embodiment

In the third embodiment, in addition to the configurations of the first embodiment and the second embodiment, a parameter (a verify parameter) used in the first verify operation in the write operation is changed according to the degree of deterioration of the memory cell MC.

Figure 27:
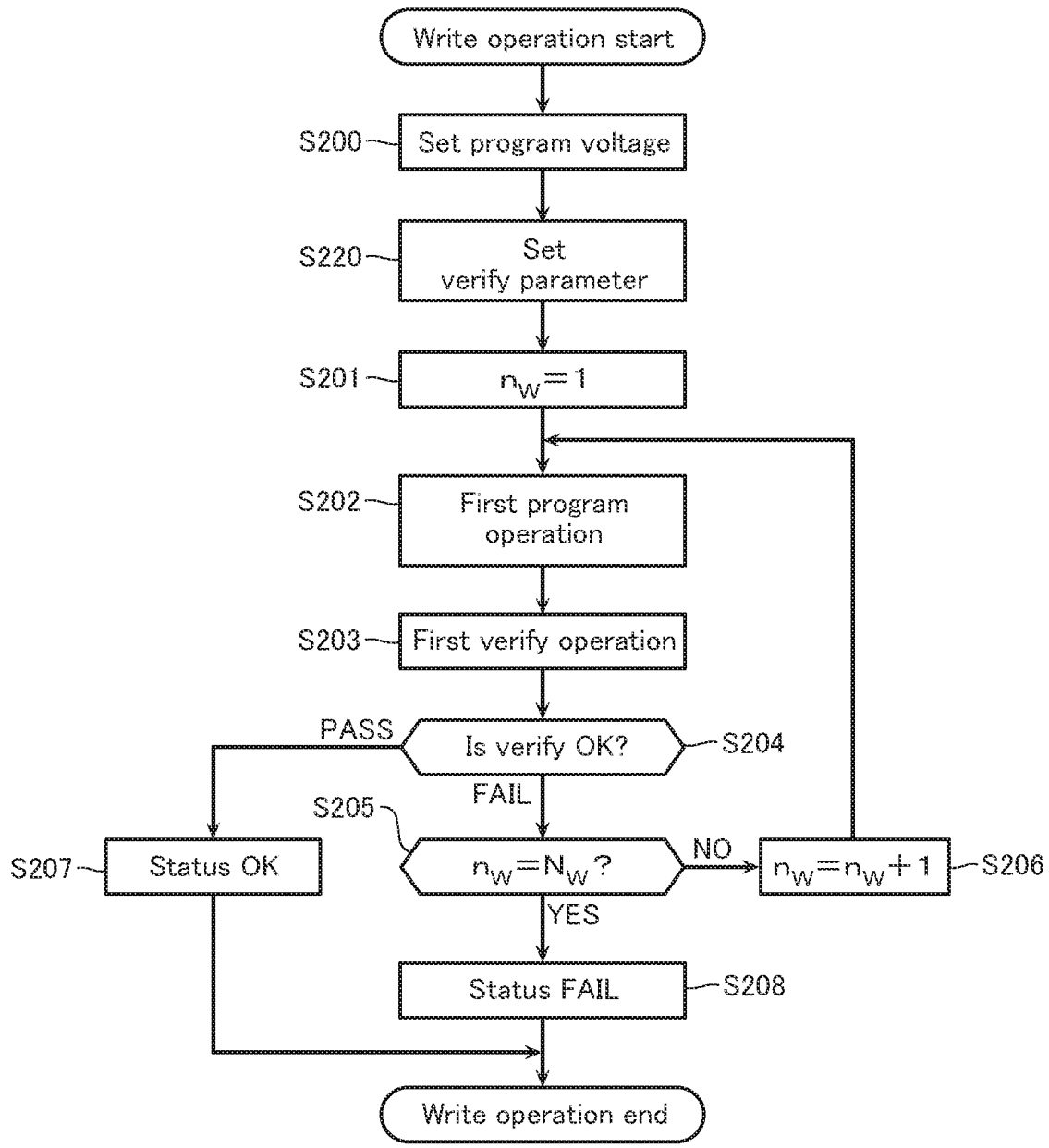
FIG. 27 is a flowchart for describing a write operation of a third embodiment.

FIG. 27 is a flowchart for describing the write operation of the third embodiment.

At Step S220, the verify parameter used for the first verify operation in the write operation is set. The verify parameter is, for example, (1) the sense time (Ts1 in FIG. 10) of the sense amplifier SA, (2) the magnitude (the voltage value) of the voltage $V_{DD}$ of the bit line BL, (3) the condition for verify PASS in the first verify operation, and (4) a condition for a verify skip operation on any state in the first verify operation.

Regarding the verify parameter (4), to reduce the unnecessary verify operation, the verify skip operation is performed on any state (one or a plurality of the state A to the state G). For example, the number of times of skip of the verify skip operation is "a condition for a verify skip operation on any state" in the verify parameter (4).

Note that in the write operation of the third embodiment, Step S200 and Steps S201 to S208 in FIG. 8 are performed similarly to the write operation of the first embodiment. Therefore, detailed descriptions of the processes will be omitted.

As described above, when the memory cell MC deteriorates, a current is less likely to flow in the bit line BL or the like. In this case, the accuracy of sense operation in the first verify operation decreases in some cases. Therefore, in the third embodiment, the verify parameters (1) to (4) are adjusted according to the degree of deterioration of the memory cell MC obtained in the program voltage control operation.

For example, the verify parameters (1) to (4) are changed according to the initial program voltage $V_{PGMS}$ obtained at Step S106 or the loop count $n_{E1}$ at the time point where the initial program voltage $V_{PGMS}$ is obtained. For example, as the deterioration of the memory cell MC proceeds, the sense time Ts1 is lengthened. As the deterioration of the memory cell MC proceeds, the voltage value of the voltage $V_{DD}$ applied to the bit line BL is increased. As the deterioration of the memory cell MC proceeds, the first reference value Cr1 at Step S204 is increased. As the deterioration of the memory cell MC proceeds, the number of times of skip of the verify skip operation on any state is reduced. However, due to the configuration of the semiconductor memory device or the like, the relationship between the degree of deterioration of the memory cell MC and the verify parameters (1) to (4) possibly changes. Therefore, the increase and decrease in the verify parameters (1) to (4) according to the degree of deterioration of the memory cell MC may be opposite to the above-described example.

According to the configuration, using the verify parameter according to the degree of deterioration of the memory cell MC, the first verify operation can be performed. As a result, the data write to the memory cell MC can be appropriately verified in the first verify operation.

Note that at Step S220, all of the verify parameters (1) to (4) may be set or any one, two, or three of the verify parameters (1) to (4) may be set.

Fourth Embodiment

In the fourth embodiment, in addition to the configurations of the first embodiment to the third embodiment, a parameter (a program parameter) used in the first program operation in the write operation is changed according to the degree of deterioration of the memory cell MC.

Figure 28:
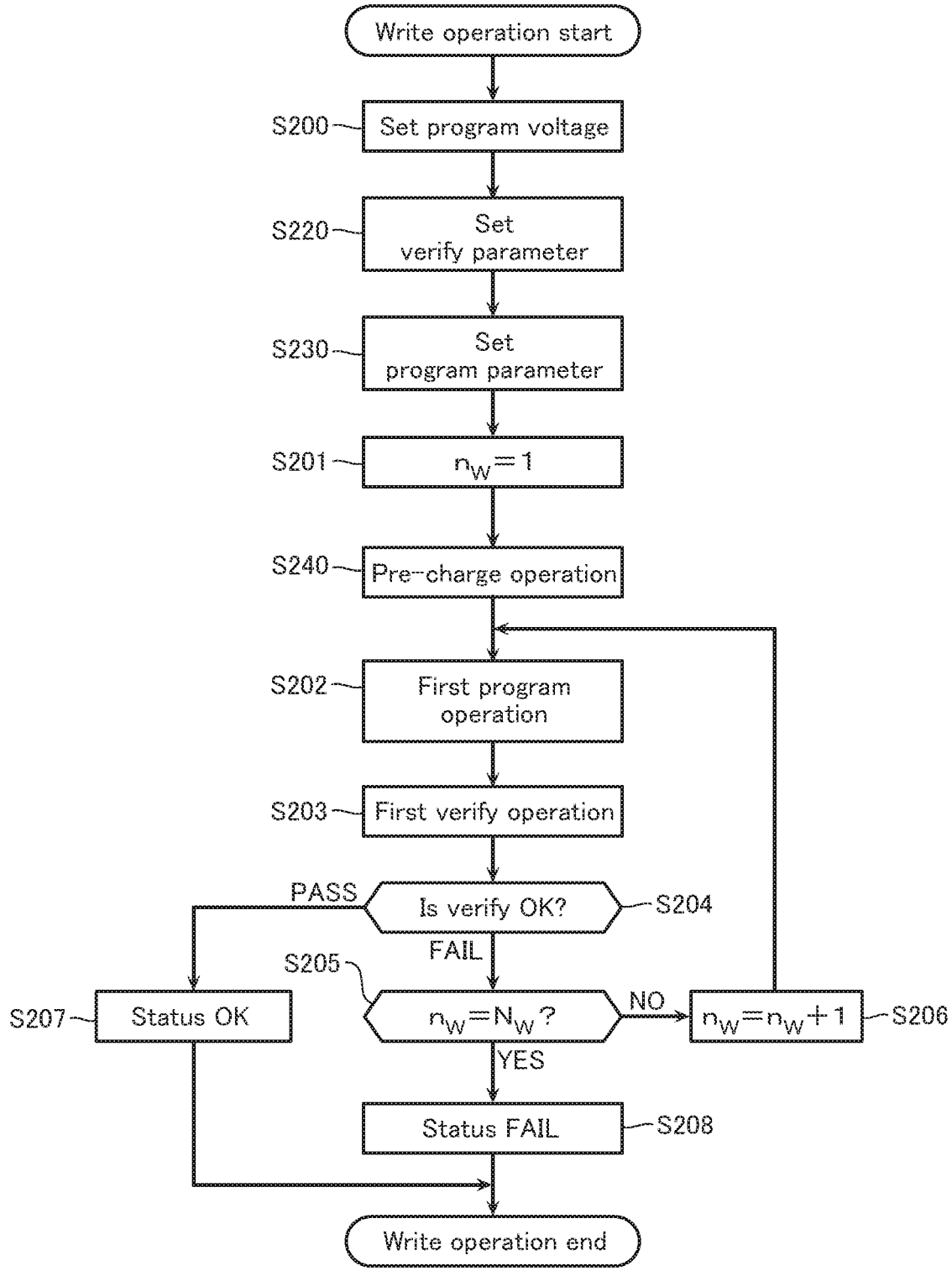
FIG. 28 is a flowchart for describing a write operation of a fourth embodiment.
Figure 29:
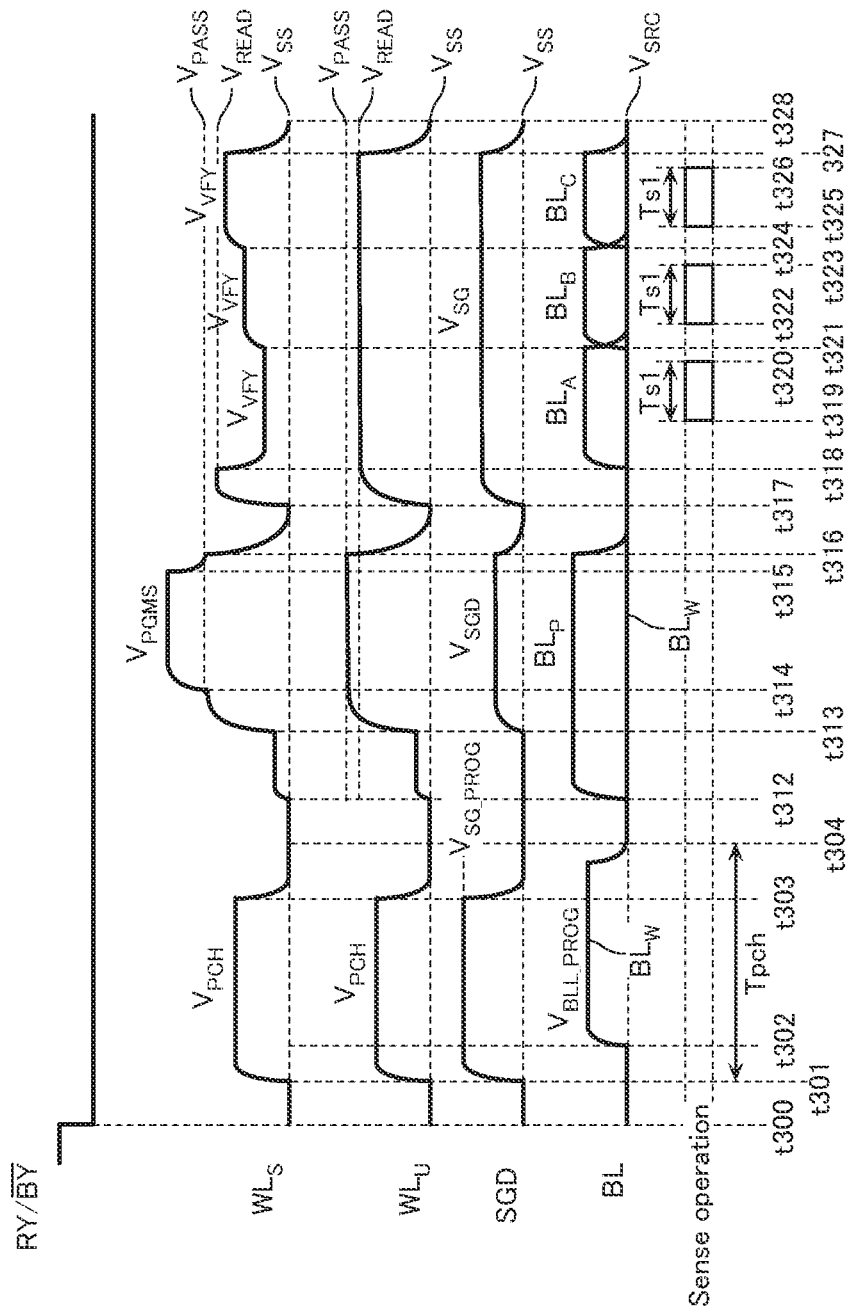
FIG. 29 is a timing chart for describing a precharge operation.

FIG. 28 is a flowchart for describing the write operation of the fourth embodiment. FIG. 29 is a timing chart for describing a precharge operation.

At Step S230, the program parameter used in the first program operation in the write operation is set. The program parameter is, for example, (1) the supply time of the program voltage $V_{PGM1}$ (Tpgm in FIG. 10), (2) the time of the precharge operation (Tpch in FIG. 29), and (3) a voltage applied to each of the word lines WL in the precharge operation ($V_{PCH}$ in FIG. 29).

The precharge operation is an operation of extracting the electrons remaining in the channel of the semiconductor column 120. This precharge operation is a preliminary operation performed before the first program operation.

In the precharge operation, for example, as illustrated in FIG. 29, in a period from timing t301 until timing t303, a voltage $V_{SG\_PROG}$ is applied to the drain-side select gate line SGD, and a voltage $V_{PCH}$ is applied to the word line WL. In the precharge operation, in a period from timing t302 until timing t304, a voltage $V_{BLL\_PROG}$ is applied to the bit line BL. A time from timing t301 until timing t304 is a time Tpch of the precharge operation. By thus applying the voltage to each of the wirings, the electrons remaining in the channel of the semiconductor column 120 are extracted.

Note that in the write operation of the fourth embodiment, Step S220, Step S220, and Steps S201 to S208 in FIG. 27 are performed similarly to the write operation of the third embodiment. Therefore, detailed descriptions of the processes will be omitted.

As described above, when the memory cell MC is deteriorated, in the first program operation, data is likely to be written in the memory cell MC. Additionally, when the memory cell MC deteriorates, a current is less likely to flow in the bit line BL or the like. Therefore, in the fourth embodiment, the program parameters of (1) to (3) are adjusted according to the degree of deterioration of the memory cell MC obtained in the program voltage control operation.

For example, the program parameters (1) to (3) are changed according to the initial program voltage $V_{PGMS}$ obtained at Step S106 or the loop count $n_{E1}$ at the time point where the initial program voltage $V_{PGMS}$ is obtained. For example, as the deterioration of the memory cell MC proceeds, the supply time Tpgm of the program voltage $V_{PGM1}$ is shortened. Additionally, as the deterioration of the memory cell MC proceeds, the time Tpch of the precharge operation is lengthened. As the deterioration of the memory cell MC proceeds, the voltage $V_{PCH}$ applied to each of the word lines WL in the precharge operation is increased.

The configuration allows performing the first program operation using the program parameter according to the degree of deterioration of the memory cell MC. As a result, in the first program operation, data can be appropriately written in the memory cell MC.

Note that at Step S230, all of the program parameters (1) to (3) may be set or any one or two of the program parameters (1) to (3) may be set.

Other Embodiments

The semiconductor memory devices according to the embodiments have been described above. However, the above-described explanations are merely examples, and the configurations, the methods, and the like described above can be appropriately adjusted.

For example, the example in which, in the execution of the erase voltage supply operation in the first to fourth embodiments, the erase voltage $V_{ERA}$ is applied to both the bit line BL and the source line SL is described. However, when the erase voltage supply operation is performed, the application of the erase voltage $V_{ERA}$ to one of the bit line BL and the source line SL may be omitted.

Additionally, in the erase operation, the program voltage control operation in which one word line WL is set as the selected word line $WL_S$ is performed one time, and the initial program voltage $V_{PGMS}$ is obtained using the result of the one-time program voltage control operation. However, in the erase operation, the program voltage control operation may be performed multiple times. In this case, each time the program voltage control operation is performed one time, the different word line WL may be set as the selected word line $WL_S$. Additionally, the initial program voltage $V_{PGMS}$ may be obtained using the result of the program voltage control operation performed multiple times. In this case, for example, by employing the average value of a plurality of initial program voltages $V_{PGMS1}$ obtained in the program voltage control operation performed multiple times, the initial program voltage $V_{PGMS}$ may be obtained.

The offset voltage $\Delta V_{PGM}$ used in the first program operation and the offset voltage $\Delta V$ used in the second program operation may be different voltages or the same voltage.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a plurality of conductive layers arranged in a first direction intersecting with a surface of the substrate;
   a first semiconductor layer that extends in the first direction and is opposed to the plurality of conductive layers;
   an electric charge accumulating layer disposed between the plurality of conductive layers and the first semiconductor layer;
   a first wiring electrically connected to one end portion in the first direction of the first semiconductor layer; and
   a control circuit electrically connected to the plurality of conductive layers and the first wiring, wherein
   the control circuit is configured to be able to perform a write operation and an erase operation,
   the write operation includes a plurality of first write loops,
   each of the plurality of first write loops includes a first program operation, and the first program operation applies a first program voltage to a first conductive layer as one of the plurality of conductive layers and applies a write pass voltage smaller than the first program voltage to a second conductive layer as one of the plurality of conductive layers,
   the first program voltage increases by a first offset voltage together with an increase in a number of times of execution of the first write loop,
   the erase operation includes:
      a program voltage control operation; and
      an erase voltage supply operation that applies an erase voltage to the first wiring after performing the program voltage control operation,
   the program voltage control operation includes a plurality of second write loops,
   each of the plurality of second write loops includes a second program operation, and the second program operation applies a second program voltage to a third conductive layer as one of the plurality of conductive layers and applies the write pass voltage to a fourth conductive layer as one of the plurality of conductive layers,
   the second program voltage increases by a second offset voltage together with an increase in a number of times of execution of the second write loop, and
   when the first program voltage in the first write loop performed first in the write operation is set as a third program voltage and the second program voltage in the second write loop performed last in the program voltage control operation is set as a fourth program voltage, a magnitude of the third program voltage is adjusted according to a magnitude of the fourth program voltage.

2. The semiconductor memory device according to claim 1, wherein
   each of the plurality of first write loops includes a first verify operation, and the first verify operation applies a first verify voltage to the first conductive layer and applies a read pass voltage smaller than the first program voltage to the second conductive layer, and
   each of the plurality of second write loops includes a second verify operation, and the second verify operation applies a second verify voltage to the third conductive layer and applies the read pass voltage to the fourth conductive layer.

3. The semiconductor memory device according to claim 2, wherein
   second verify data obtained by the second verify operation includes first data corresponding to a bit of verify PASS and second data corresponding to a bit of verify FAIL, and
   each of the plurality of second write loops includes a second determination operation, and the second determination operation determines whether a count of the first data or the second data is within a second reference value or not.

4. The semiconductor memory device according to claim 1, wherein
   the program voltage control operation includes a pre-read operation, and the pre-read operation applies a read voltage to the third conductive layer before performing the second program operation and applies a read pass voltage smaller than the first program voltage to the fourth conductive layer.

5. The semiconductor memory device according to claim 3, wherein
   the program voltage control operation includes a pre-read operation, and the pre-read operation applies a read voltage to the third conductive layer before performing the second program operation and applies the read pass voltage to the fourth conductive layer,
   the read data obtained by the pre-read operation includes third data and fourth data, the third data corresponds to a bit of an ON state, and the fourth data corresponds to a bit of an OFF state, and
   the second reference value is changed according to a count of the third data or the fourth data.

6. The semiconductor memory device according to claim 1, wherein
   at least one of a magnitude of the erase voltage and a supply time of the erase voltage is changed according to the magnitude of the fourth program voltage.

7. The semiconductor memory device according to claim 1, wherein the control circuit includes a sense amplifier electrically connected to the first wiring, the erase operation includes an erase verify operation, and the erase verify operation applies an erase verify voltage smaller than the erase voltage to the plurality of conductive layers and senses a voltage of the first wiring by the sense amplifier after performing the erase voltage supply operation, and a sense time of the sense amplifier is changed according to the magnitude of the fourth program voltage.

8. The semiconductor memory device according to claim 1, wherein the write operation includes a first verify operation, and the first verify operation applies a first voltage to the first wiring, applies a first verify voltage smaller than the write pass voltage to the first conductive layer, and applies a read pass voltage larger than the first verify voltage to the second conductive layer after performing the first program operation, and at least one of a magnitude of the first voltage and a condition for skipping the first verify operation is changed according to the magnitude of the fourth program voltage.

9. The semiconductor memory device according to claim 2, wherein the control circuit includes a sense amplifier electrically connected to the first wiring, in the first verify operation, the sense amplifier senses a voltage of the first wiring, and a sense time of the sense amplifier is changed according to the magnitude of the fourth program voltage.

10. The semiconductor memory device according to claim 8, wherein first verify data obtained by the first verify operation includes fifth data and sixth data, the fifth data corresponds to a bit of verify PASS, and sixth data corresponds to a bit of verify FAIL, and the write operation includes a first determination operation that determines whether a count of the fifth data or the sixth data is less than a first reference value or not, and the first reference value is changed according to the magnitude of the fourth program voltage.

11. The semiconductor memory device according to claim 1, wherein in the first program operation, a supply time of the first program voltage is changed according to the magnitude of the fourth program voltage.

12. The semiconductor memory device according to claim 1, wherein the write operation includes a precharge operation that applies a precharge voltage to the first conductive layer and the second conductive layer before performing the first program operation, and at least one of the precharge voltage and a supply time of the precharge voltage is changed according to the magnitude of the fourth program voltage.

\* \* \* \* \*